United States Patent
Jou et al.

(10) Patent No.: US 9,972,995 B2
(45) Date of Patent: May 15, 2018

(54) CIRCUIT WITH A DROOP COMPENSATING MECHANISM

(71) Applicant: Taiwan Semiconductor Manufacturing Company Limited, Hsinchu (TW)

(72) Inventors: Chewn-Pu Jou, Hsinchu (TW); Huan-Neng Chen, Taichung (TW); Chien-Jung Wang, Hsinchu (TW)

(73) Assignee: Taiwan Semiconductor Manufacturing Company LImited, Hsinchu (TW)

( * ) Notice: Subject to any disclaimer, the term of this patent is extended or adjusted under 35 U.S.C. 154(b) by 333 days.

(21) Appl. No.: 14/864,971

(22) Filed: Sep. 25, 2015

(65) Prior Publication Data

US 2016/0013633 A1 Jan. 14, 2016

Related U.S. Application Data

(63) Continuation-in-part of application No. 14/046,951, filed on Oct. 5, 2013, now Pat. No. 9,502,886.

(51) Int. Cl.
| | | |
|---|---|---|
| *H01H 35/00* | (2006.01) | |
| *H01H 83/00* | (2006.01) | |
| *H02H 7/16* | (2006.01) | |
| *G11C 5/14* | (2006.01) | |

(52) U.S. Cl.
CPC ............... *H02H 7/16* (2013.01); *G11C 5/141* (2013.01); *Y10T 307/766* (2015.04)

(58) Field of Classification Search
CPC ........ H02H 7/16; Y10T 307/766; G11C 5/141
See application file for complete search history.

(56) References Cited

U.S. PATENT DOCUMENTS

| | | | | |
|---|---|---|---|---|
| 6,023,187 A | * | 2/2000 | Camacho | H02M 3/073 327/536 |
| 6,054,781 A | * | 4/2000 | He | H02J 1/02 307/105 |
| 7,812,664 B1 | * | 10/2010 | Duong | H03K 19/00346 327/310 |
| 2007/0046369 A1 | * | 3/2007 | Schober | G06K 19/0707 330/7 |
| 2009/0033289 A1 | * | 2/2009 | Xing | H02J 7/0065 320/140 |
| 2012/0170770 A1 | * | 7/2012 | Lesso | H02M 3/07 381/107 |
| 2013/0049735 A1 | * | 2/2013 | Shafer | H03F 1/523 324/76.11 |
| 2013/0076320 A1 | * | 3/2013 | Chan | H02M 3/1588 323/271 |
| 2014/0152388 A1 | * | 6/2014 | Lesso | H02M 3/07 330/279 |

* cited by examiner

*Primary Examiner* — Jared Fureman
*Assistant Examiner* — Esayas Yeshaw
(74) *Attorney, Agent, or Firm* — Jones Day

(57) ABSTRACT

A method includes charging a capacitor connected to an input node, gradually decreasing an output voltage at an output node, and electrically connecting the input node to the output node. A circuit that performs the method is also disclosed. A system that includes the circuit is also disclosed.

20 Claims, 19 Drawing Sheets

CIRCUIT WITH A DROOP COMPENSATING MECHANISM

CROSS-REFERENCE TO A RELATED APPLICATION

This application is a continuation-in-part of U.S. patent application Ser. No. 14/046,951, entitled "MIM CAPACITOR," filed Oct. 5, 2013, which is incorporated herein by reference in its entirety.

BACKGROUND

Some circuits are configured to couple one or more electrical components to one or more other electrical components. Such circuits are commonly found in circuitry of various devices, such as personal computers and cellular phones. Such circuits are also commonly found in memory circuitry.

DETAILED DESCRIPTION

Figure 1:
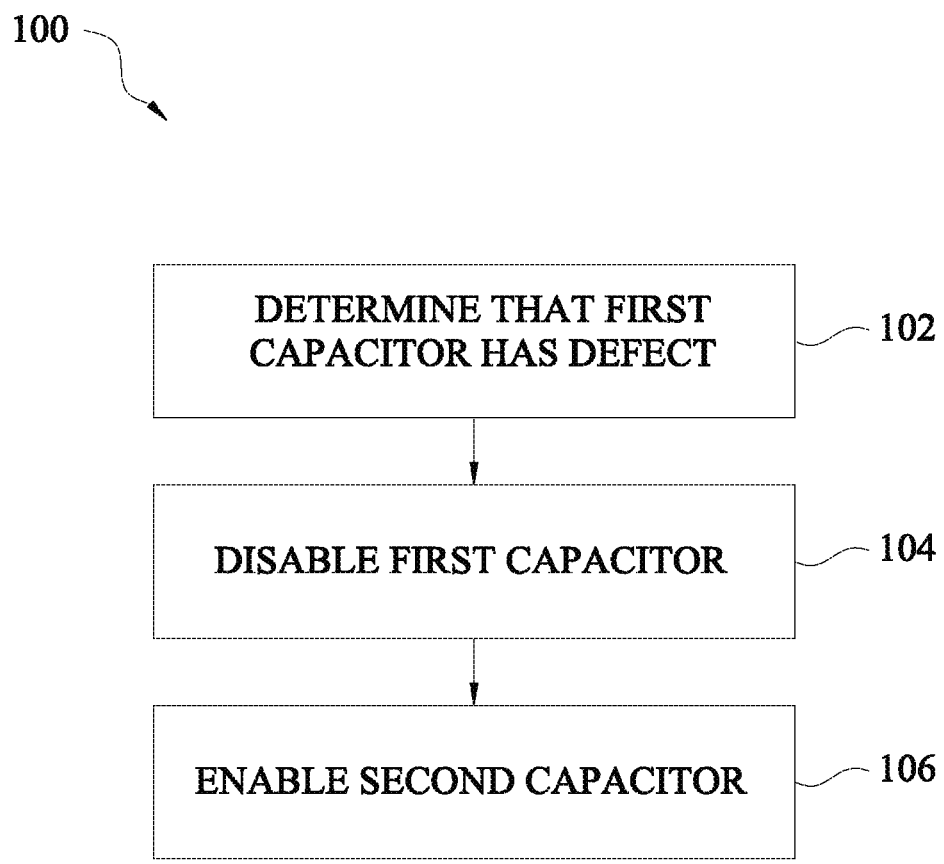
FIG. 1 is a flow diagram illustrating the first exemplary embodiment of a method according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more circuits/systems and one or more techniques for using such circuits/systems, for example, are provided herein. The one or more circuits/systems include a capacitor that lengthens or delays duration of a decrease or droop of an output voltage. The one or more circuits/systems further include a droop compensating mechanism that compensates for output voltage droop, in a manner that will be described hereinafter, and that includes a transistor and a capacitor.

In some embodiments, the transistor comprises an n-type metal-oxide semiconductor field-effect transistor (nMOSFET), a p-type metal-oxide semiconductor field-effect transistor (pMOSFET), an insulated gate bipolar transistor (IGBT), a bipolar junction transistor (BJT), a field-effect transistor (FET), or any other suitable transistor, so long as it functions as described herein.

In some embodiments, the capacitor comprises a High Density (HD) Metal-Insulator-Metal (MiM) capacitor, an HD Metal-Oxide-Metal (MoM) capacitor, a metal-oxide-semiconductor capacitor (MOSCAP), or any capacitor having a high capacitance density, e.g., greater than 2 fF/$\mu m^2$.

A method 100 of managing one or more electronic devices, according to some embodiments, is illustrated in FIG. 1, and one or more circuits used to implement such a methodology are illustrated in FIG. 3A, FIG. 3B, FIG. 4, FIG. 5, FIG. 6 and FIG. 7. At 102, a determination is made that a first capacitor has a defect. At 104, the first capacitor is disabled. In some embodiments, the disabling of the first capacitor is performed responsive to the determination that the first capacitor has the defect. At 106, a second capacitor is enabled. In some embodiments, the enabling of the second capacitor is performed responsive to at least one of the determination that the first capacitor has the defect or the disabling of the first capacitor.

Figure 2:
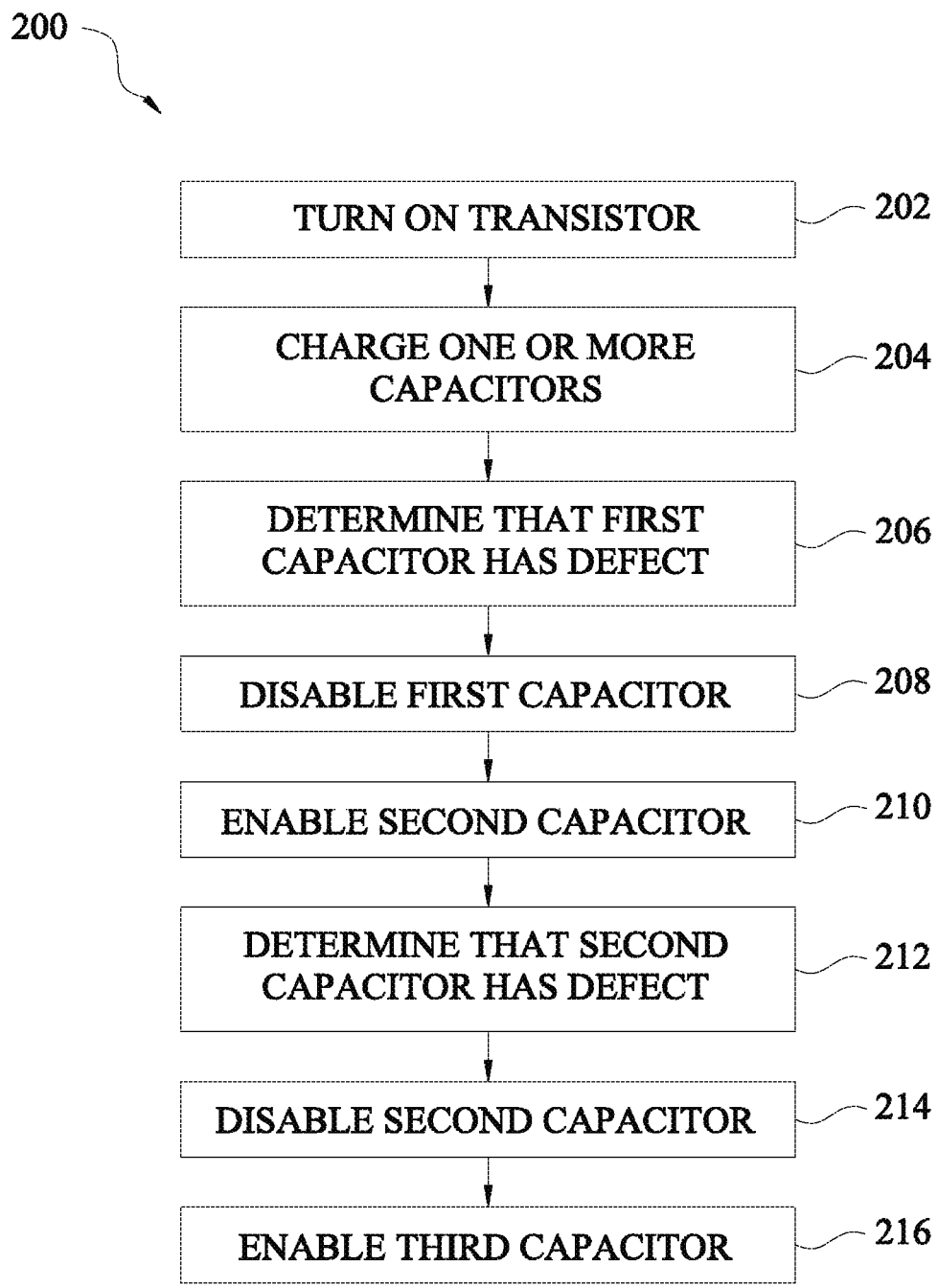
FIG. 2 is a flow diagram illustrating the second exemplary embodiment of a method according to some embodiments.

A method 200 of managing one or more electronic devices, according to some embodiments, is illustrated in FIG. 2, and one or more circuits used to implement such a methodology are illustrated in FIG. 3A, FIG. 3B, FIG. 4, FIG. 5, FIG. 6 and FIG. 7. At 202, a transistor is turned on. In some embodiments, the transistor comprises a pMOSFET. In other embodiments, the transistor comprises an nMOSFET, an IGBT, a BJT, a FET, or any other suitable transistor, so long as it functions as intended. The transistor is coupled to a first capacitor. At 204, one or more capacitors are charged. The one or more capacitors comprise the first capacitor, a second capacitor and a third capacitor in some embodiments. At 206, a determination is made that the first capacitor has a defect. At 208, the first capacitor is disabled. In some embodiments, the disabling of the first capacitor is performed responsive to the determination that the first capacitor has the defect. At 210, the second capacitor is enabled. In some embodiments, the enabling of the second capacitor is performed responsive to at least one of the determination that the first capacitor has the defect or the disabling of the first capacitor. At 212, a determination is made that the second capacitor has a defect. At 214, the second capacitor is disabled. In some embodiments, the disabling of the second capacitor is performed responsive to the determination that the second capacitor has the defect. At 216, the third capacitor is enabled. In some embodiments, the enabling of the third capacitor is performed responsive to at least one of the determination that the second capacitor has the defect or the disabling of the second capacitor.

Figure 3A:
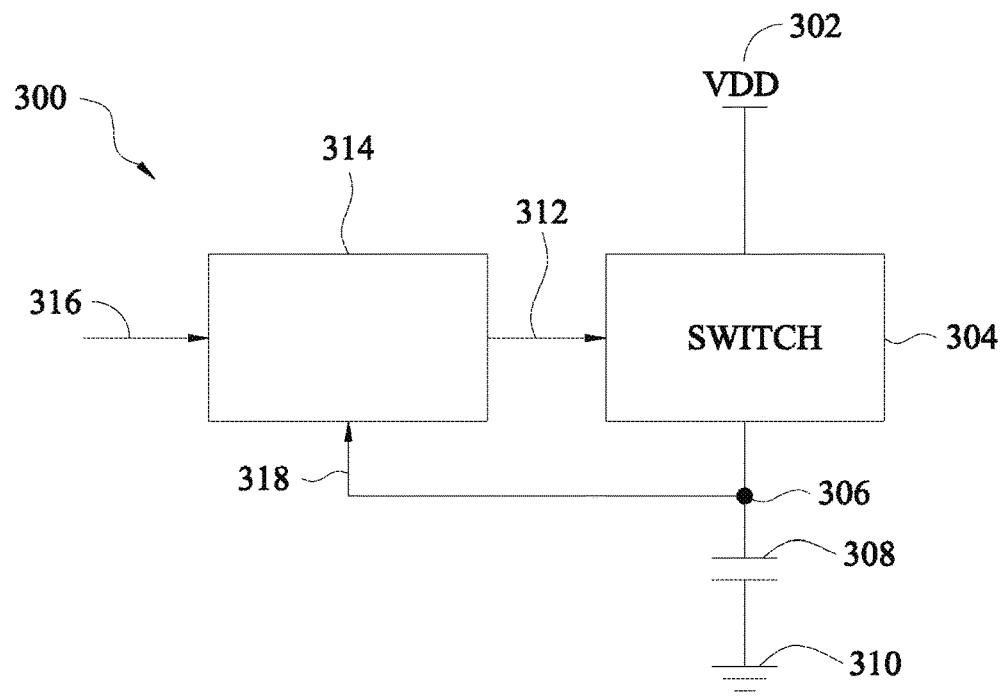
FIG. 3A is an illustration of the first exemplary embodiment of a system according to some embodiments.

A system 300 comprising an electronic device, according to some embodiments, is illustrated at least in part in FIG. 3A. The system 300 comprises a switch 304, a capacitor 308 and a device 314, and is coupled to a voltage source 302. The voltage source 302 is coupled to the switch 304. The switch 304 is configured to be activated when the capacitor 308 is functioning properly and deactivated when a defect, e.g., a leakage current or a short, occurs in the capacitor 308, in some embodiments. The switch 304 is coupled to the capacitor 308. The capacitor 308 is coupled to ground 310. A node 306 is located between the switch 304 and the capacitor 308 in some embodiments. The node 306 is connected to the device 314. In some embodiments, the node 306 provides a signal 318 to the device 314. The signal 318 provided to the device 314 corresponds to a detection associated with the capacitor 308 that determines whether the capacitor 308 is functioning properly or has a defect in some embodiments. In such some embodiments, the signal 318 is either at a capacitor-enabling voltage level indicating that the detection associated with the capacitor 308 determines that the capacitor 308 is functioning properly, or at a capacitor-disabling voltage level indicating that the detection associated with the capacitor 308 determines that capacitor 308 has a defect. The device 314 is coupled to the switch 304. In some embodiments, the device 314 provides a signal 312 to the switch 304. The signal 312 provided to the switch 304 corresponds to whether the switch 304 is activated or deactivated in some embodiments. In such some embodiments, the signal 312 is either at a switch-activating voltage level that activates the switch 304 when the signal 318 is at the capacitor-enabling voltage level, or at a switch-deactivating voltage level that deactivates the switch 304 when the signal 318 is at the capacitor-disabling voltage level. In some embodiments, the device 314 is configured to receive a signal 316. The signal 316 corresponds to an initial set which is associated with activating or deactivating the switch 304, in some embodiments. In such some embodiments, the signal 316 is either at a device-enabling voltage level that enables the device 314 to provide the signal 312 at the switch-activating voltage level/switch-deactivating voltage level when the signal 318 is at the capacitor-enabling voltage level/capacitor-disabling voltage level, or at a device-disabling voltage level that causes the device 314 to provide the signal 312 at the switch-activating voltage, thereby activating the switch 304, regardless of whether the signal 318 is at the capacitor-enabling voltage level or the capacitor-disabling voltage level, i.e., regardless of whether the capacitor 308 is functioning properly or has a defect, thereby allowing charging of the capacitor 308 prior to the detection associated with the capacitor 308 that determines whether the capacitor 308 is functioning properly or has a defect.

Figure 3B:
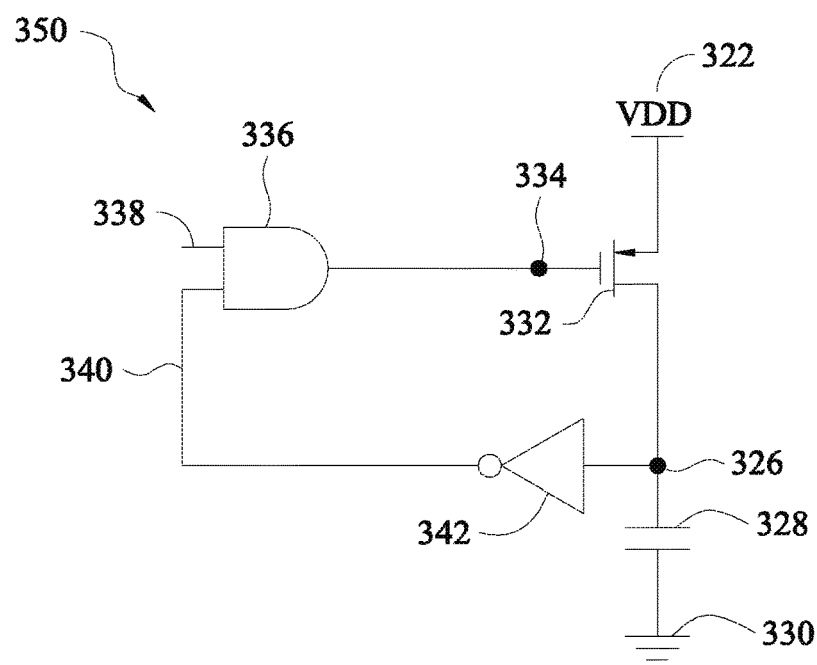
FIG. 3B is an illustration of a device and a switch of the system of FIG. 3A according to some embodiments.

A system 350 comprising an electronic device, according to some embodiments, is illustrated at least in part in FIG. 3B. The system 350 illustrated in FIG. 3B is similar or substantially the same as the system 300 illustrated in FIG. 3A. The system 350 comprises a capacitor 328, a transistor 332, a first logic gate 336 and a second logic gate 342, and is coupled to a voltage source 322. In some embodiments, the transistor 332 corresponds to or is similar to the switch 304 of FIG. 3A. In some embodiments, at least one of the first logic gate 336 and the second logic gate 342 corresponds to or is similar to the device 314 of FIG. 3A. The first logic gate 336 comprises an AND logic gate in some embodiments. The second logic gate 342 comprises a NOT logic gate in some embodiments. The voltage source 322 is coupled to the transistor 332. The transistor 332 is configured to be activated when the capacitor 328 is functioning properly and deactivated when a defect, e.g., a leakage current or a short, occurs in the capacitor 328, in some embodiments. The transistor 332 is coupled to the capacitor 328. The capacitor 328 is coupled to ground 330. A node 326 is located between the transistor 332 and the capacitor 328 in some embodiments. The node 326 is connected to the second logic gate 342. In some embodiments, the node 326 provides a signal to the second logic gate 342. The signal provided to the second logic gate 342 corresponds to a detection associated with the capacitor 328 that determines whether the capacitor 328 is functioning properly or has a defect in some embodiments. In such some embodiments, the signal provided to the second logic gate 342 is either at a high voltage level indicating that the detection associated with the capacitor 328 determines that the capacitor 328 is functioning properly, or at a low voltage level indicating that the detection associated with the capacitor 328 determines that the capacitor 328 has a defect. The second logic gate 342 is coupled to the first logic gate 336 via a path 340. In some embodiments, the first logic gate 336 provides a signal via node 334 to the transistor 332. The signal provided to the transistor 332 corresponds to whether the transistor 332 is activated or deactivated in some embodiments. In such some embodiments, the signal provided to the transistor 332 is either at the low voltage level that activates the transistor 332 when the signal provided to the second logic gate 342 is at the high voltage level, or at the high voltage level that deactivates the transistor 332 when the signal provided to the second logic gate 342 is at the low voltage level. In some embodiments, the first logic gate 336 is configured to receive a signal via path 338. The signal received via the path 338 corresponds to an initial set which is associated with activating or deactivating the transistor 332 in some embodiments. In such some embodiments, the signal received via the path 338 is either at the high voltage level that enables the first logic gate 336 to provide the signal to the transistor 332 at the low voltage level/high voltage level when the signal provided to the second logic gate 342 is at the high voltage level/low voltage level, or at a low voltage level that causes the first logic gate 336 to provide the signal to the transistor 332 at the low voltage level, thereby activating the transistor 332, regardless of whether the signal provided to the second logic gate 342 is at the low voltage level or the high voltage level, i.e., regardless of whether the capacitor 328 is functioning properly or has a defect, thereby allowing charging of the capacitor 328 prior to the detection associated with the capacitor 328 that determines whether the capacitor 328 is functioning properly or has a defect.

Figure 4:
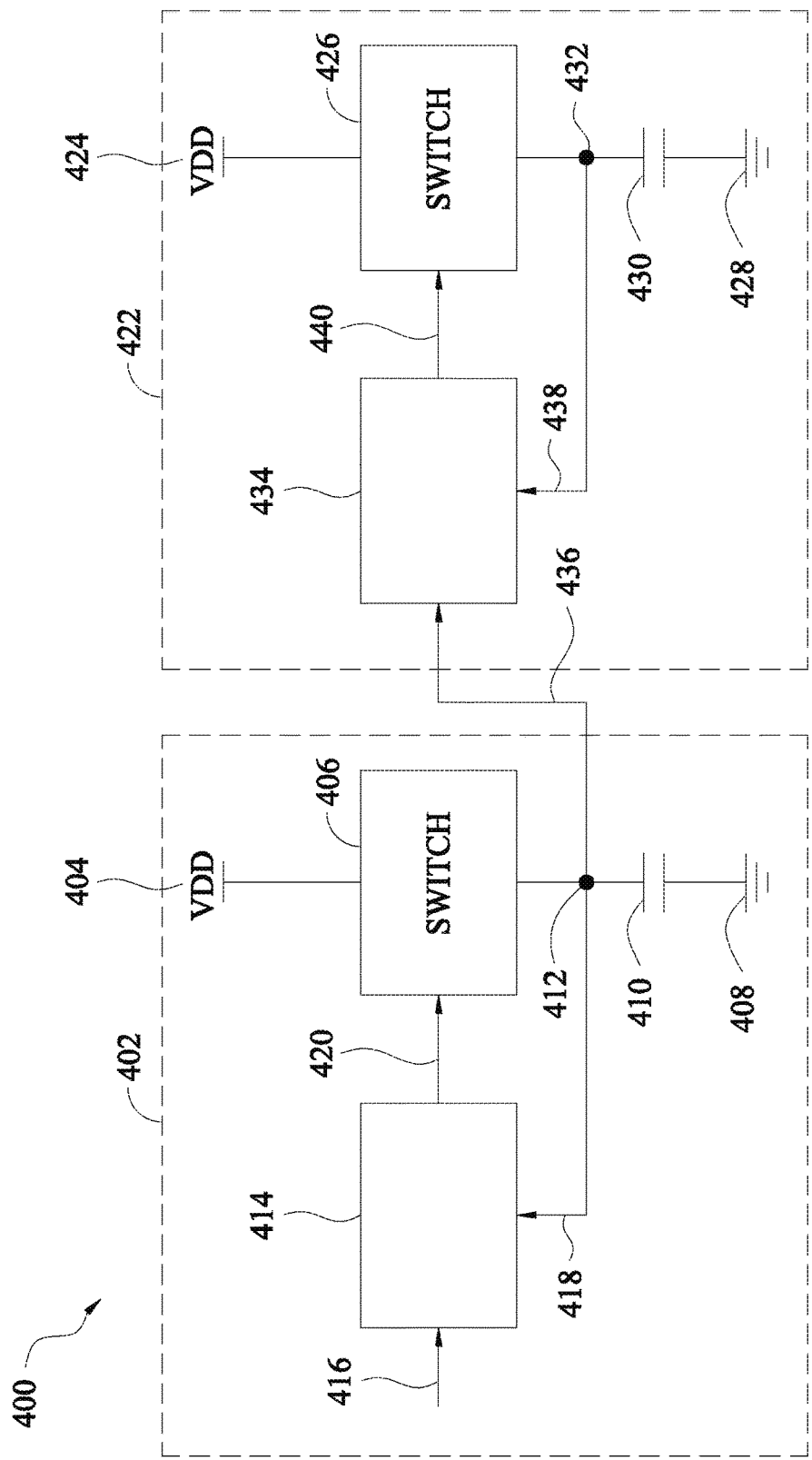
FIG. 4 is an illustration of the second exemplary embodiment of a system according to some embodiments.

A system 400 comprising a first electronic device 402 and a second electronic device 422, according to some embodiments, is illustrated at least in part in FIG. 4.

The first electronic device 402 comprises a switch 406, a capacitor 410 and a device 414, and is coupled to a voltage source 404. The voltage source 404 is coupled to the switch 406. The switch 406 is configured to be activated when the capacitor 410 is functioning properly and deactivated when a defect, e.g., a leakage current or a short, occurs in the capacitor 410, in some embodiments. The switch 406 is coupled to the capacitor 410. The capacitor 410 is coupled to ground 408. A node 412 is located between the switch 406 and the capacitor 410, in some embodiments. The node 412 is connected to the device 414. In some embodiments, the node 412 provides a signal 418 to the device 414. The signal 418 provided to the device 414 corresponds to a detection associated with the capacitor 410 that determines whether the capacitor 410 is functioning properly or has a defect in some embodiments. In such some embodiments, the signal 418 is either at a capacitor-enabling voltage level indicating that the detection associated with the capacitor 410 determines that the capacitor 410 is functioning properly, or at a capacitor-disabling voltage level indicating that the detection associated with the capacitor 410 determines that capacitor 410 has a defect. The device 414 is coupled to the switch 406. In some embodiments, the device 414 provides a signal 420 to the switch 406. The signal 420 provided to the switch 406 corresponds to whether the switch 406 is activated or deactivated, in some embodiments. In such some embodiments, the signal 420 is either at a switch-activating voltage level that activates the switch 406 when the signal 418 is at the capacitor-enabling voltage level, or at a switch-deactivating voltage level that deactivates the switch 406 when the signal 418 is at the capacitor-disabling voltage level. In some embodiments, the device 414 is configured to receive a signal 416. The signal 416 corresponds to an initial set which is associated with activating or deactivating the switch 406, in some embodiments. In such some embodiments, the signal 416 is either at a device-enabling voltage level that enables the device 414 to provide the signal 420 at the switch-activating voltage level/switch-deactivating voltage level when the signal 418 is at the capacitor-enabling voltage level/capacitor-disabling voltage level, or at a device-disabling voltage level that causes the device 414 to provide the signal 420 at the switch-activating voltage level, thereby activating the switch 406, regardless of whether the signal 418 is at the capacitor-enabling voltage level or the capacitor-disabling voltage level, i.e., regardless of whether the capacitor 410 is functioning properly or has a defect.

The second electronic device 422 comprises a switch 426, a capacitor 430 and a device 434, and is coupled to a voltage source 424. The voltage source 424 is coupled to the switch 426. The switch 426 is configured to be activated when the capacitor 430 is functioning properly and deactivated when a defect, e.g., a leakage current or a short, occurs in the capacitor 430, in some embodiments. The switch 426 is coupled to the capacitor 430. The capacitor 430 is coupled to ground 428. A node 432 is located between the switch 426 and the capacitor 430 in some embodiments. The node 432 is connected to the device 434. In some embodiments, the node 432 provides a signal 438 to the device 434. The signal 438 provided to the device 434 corresponds to a detection associated with the capacitor 430 that determines whether the capacitor 430 is functioning properly or has a defect in some embodiments. In such some embodiments, the signal 438 is either at a capacitor-enabling voltage level indicating that the detection associated with the capacitor 430 determines that the capacitor 430 is functioning properly, or at a capacitor-disabling voltage level indicating that the detection associated with the capacitor 430 determines that capacitor 430 has a defect. The device 434 is coupled to the switch 426. In some embodiments, the device 434 provides a signal 440 to the switch 426. The signal 440 provided to the switch 426 corresponds to whether the switch 426 is activated or deactivated in some embodiments. In such some embodiments, the signal 440 is either at a switch-activating voltage level that activates the switch 426 when the signal 438 is at the capacitor-enabling voltage level, or at a switch-deactivating voltage level that deactivates the switch 426 when the signal 438 is at the capacitor-disabling voltage level. In some embodiments, the device 434 is configured to receive a signal 436. In some embodiments, the signal 436 corresponds to an initial set which is associated with activating or deactivating the switch 426. The signal 436, in some embodiments, is received by the device 434 from the node 412 of the first electronic device 402. In some embodiments, the signal 436 is provided from the node 412 of the first electronic device 402 based upon a determination that the capacitor 410 or one or more other portions of the first electronic device 402 is defective. In such some embodiments, the signal 436 is either at a device-enabling voltage level that enables the device 434 to provide the signal 440 at the switch-activating voltage level/switch-deactivating voltage level when the signal 438 is at the capacitor-enabling voltage level/capacitor-disabling voltage level, or at a device-disabling voltage level that causes the device 434 to provide the signal 440 at the switch-deactivating voltage, thereby deactivating the switch 426, regardless of whether the signal 438 is at the capacitor-enabling voltage level or the capacitor-disabling voltage level, i.e., regardless of whether the capacitor 430 is functioning properly or has a defect.

Figure 5:
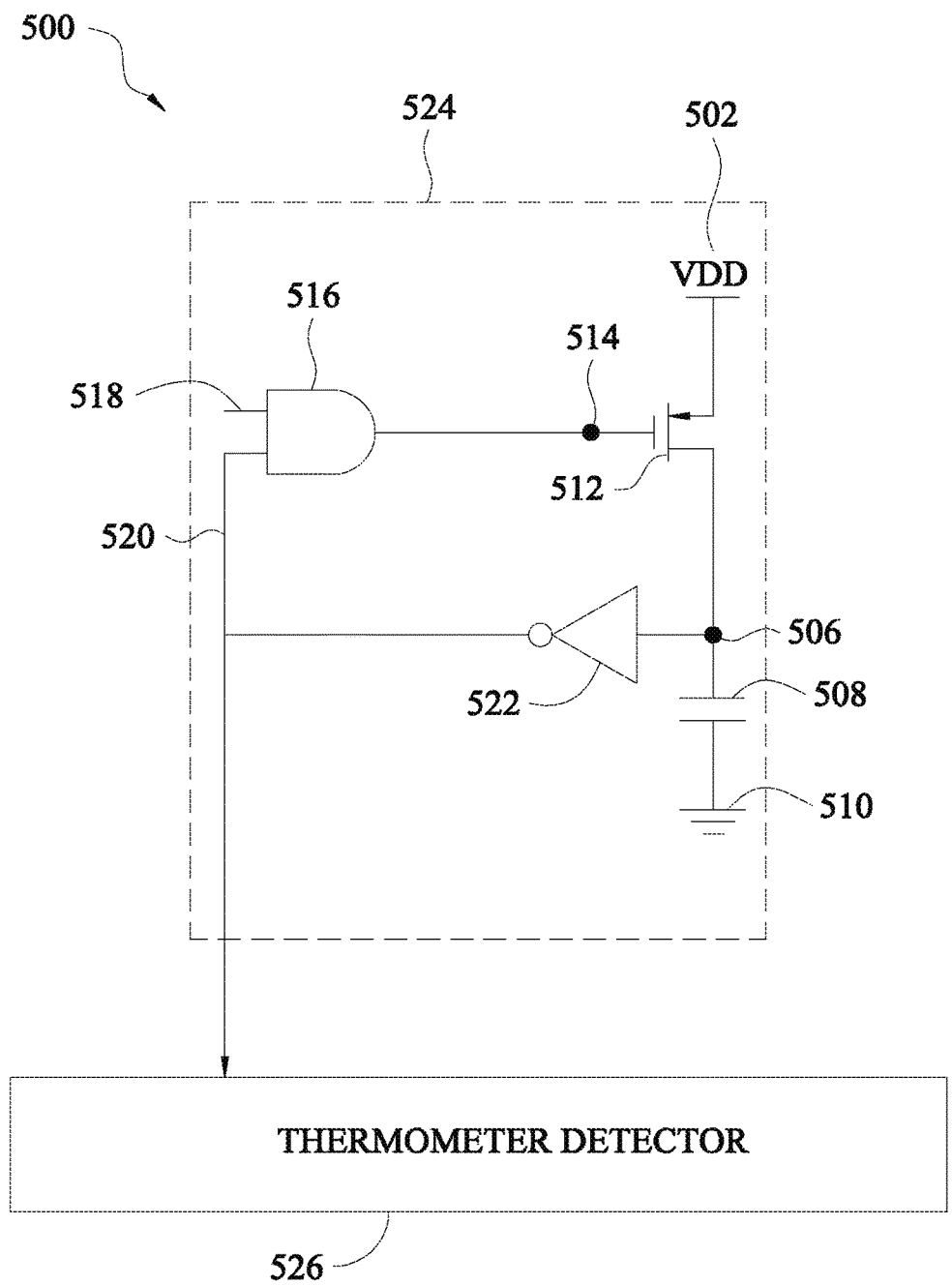
FIG. 5 is an illustration of the third exemplary embodiment of a system according to some embodiments.

A system 500 comprising a first electronic device 524 and a thermometer detector 526, according to some embodiments, is illustrated at least in part in FIG. 5. The first electronic device 524 illustrated in FIG. 5 is similar or substantially the same as the system 350 illustrated in FIG. 3B.

The first electronic device 524 comprises a capacitor 508, a transistor 512, a first logic gate 516 and a second logic gate 522, and is coupled to a voltage source 502. The first logic gate 516 comprises an AND logic gate in some embodiments. The second logic gate 522 comprises a NOT logic gate in some embodiments. The voltage source 502 is coupled to the transistor 512. The transistor 512 is configured to be activated when the capacitor 508 is functioning properly and deactivated when a defect, e.g., a leakage current or a short, occurs in the capacitor 508, in some embodiments. The transistor 512 is coupled to the capacitor 508. The capacitor 508 is coupled to ground 510. A node 506 is located between the transistor 512 and the capacitor 508 in some embodiments. The node 506 is connected to the second logic gate 522. In some embodiments, the node 506 provides a signal to the second logic gate 522. The signal provided to the second logic gate 522 corresponds to a detection associated with the capacitor 508 that determines whether the capacitor 508 is functioning properly or has a defect in some embodiments. In such some embodiments, the signal provided to the second logic gate 522 is either at a high voltage level indicating that the detection associated with the capacitor 508 determines that the capacitor 508 is functioning properly, or at a low voltage level indicating that the detection associated with the capacitor 508 determines that the capacitor 508 has a defect. The second logic gate 522 is coupled to the first logic gate 516. In some embodiments, the first logic gate 516 provides a signal via node 514 to the transistor 512. The signal provided to the transistor 512 corresponds to whether the transistor 512 is activated or deactivated in some embodiments. In such some embodiments, the signal provided to the transistor 512 is either at the low voltage level that activates the transistor 512 when the signal provided to the second logic gate 522 is at the high voltage level, or at the high voltage level that deactivates the transistor 512 when the signal provided to the second logic gate 522 is at the low voltage level. In some embodiments, the first logic gate 516 is configured to receive a signal via path 518. The signal received via the path 518 corresponds to an initial set which is associated with activating or deactivating the transistor 512 in some embodiments. In such some embodiments, the signal received via the path 518 is either at the high voltage level that enables the first logic gate 516 to provide the signal to the transistor 512 at the low voltage level/high voltage level when the signal provided to the second logic gate 522 is at the high voltage level/low voltage level, or at a low voltage level that causes the first logic gate 516 to provide the signal to the transistor 512 at the low voltage level, thereby activating the transistor 512, regardless of whether the signal provided to the second logic gate 522 is at the low voltage level or the high voltage level, i.e., regardless of whether the capacitor 508 is functioning properly or has a defect, thereby allowing charging of the capacitor 508 prior to the detection associated with the capacitor 508 that determines whether the capacitor 508 is functioning properly or has a defect.

The thermometer detector 526 is coupled to the first electronic device 524, and at least one of sends a signal to or receives a signal from 520 the first electronic device 524. In some embodiments, the thermometer detector 526 counts a first number of capacitors that are at least one of defective or failed. In some embodiments, the thermometer detector 526 turns on one or more capacitors through one or more OR gates. The one or more capacitors turned on by the thermometer detector 526 corresponds to the first number of capacitors determined to be at least one of defective or failed, in some embodiments.

Figure 6:
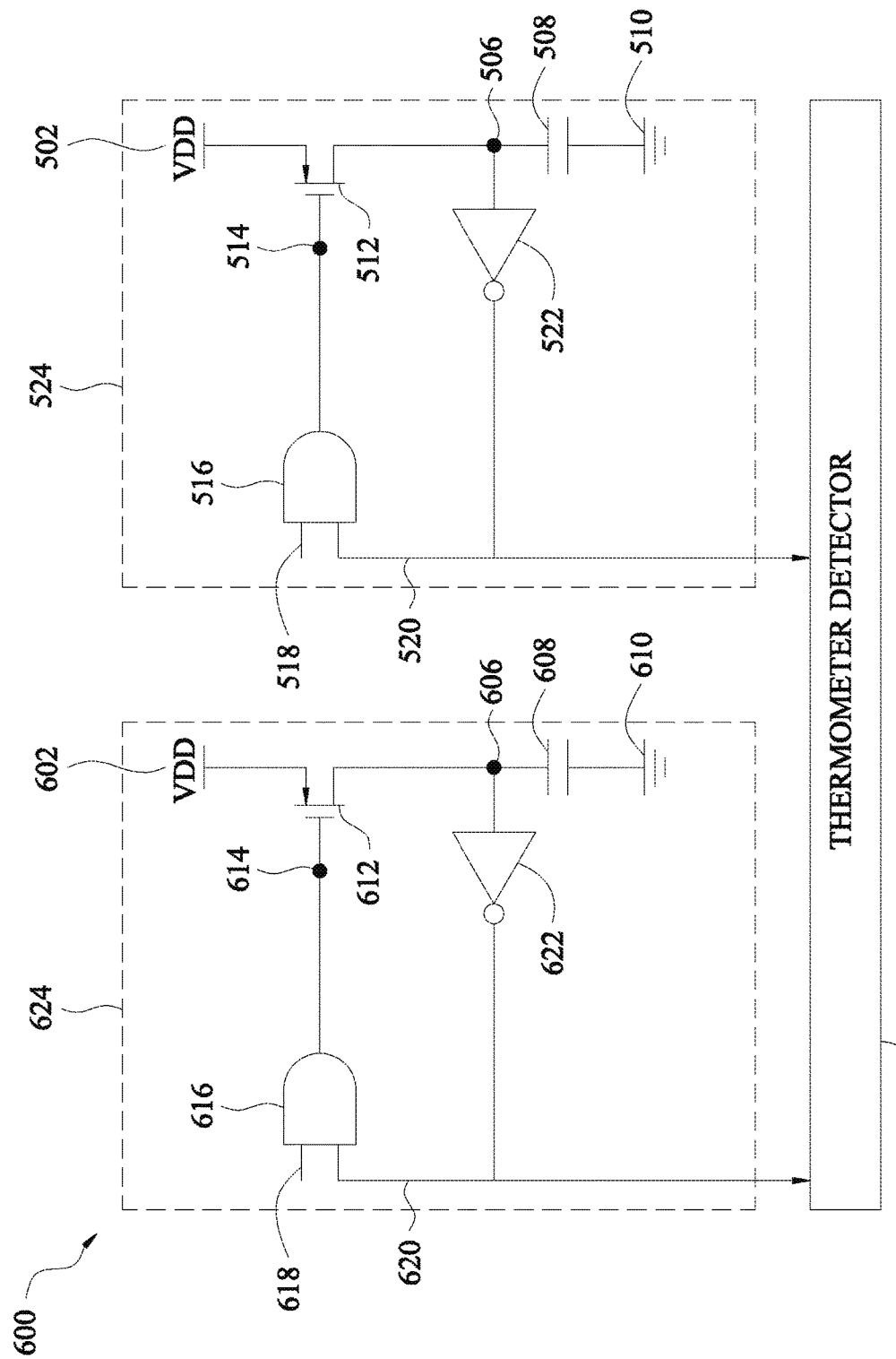
FIG. 6 is an illustration of the fourth exemplary embodiment of a system according to some embodiments.

A system 600 comprising the first electronic device 524 illustrated in FIG. 5, the thermometer detector 526 illustrated in FIG. 5, and a second electronic device 624, according to some embodiments, is illustrated at least in part in FIG. 6.

The second electronic device 624 comprises a capacitor 608, a transistor 612, a first logic gate 616 and a second logic gate 622, and is coupled to a voltage source 602. The first logic gate 616 comprises an AND logic gate in some embodiments. The second logic gate 622 comprises a NOT logic gate in some embodiments. The voltage source 602 is coupled to the transistor 612. The transistor 612 is configured to be activated when the capacitor 608 is functioning properly and deactivated when a defect, e.g., a leakage current or a short, occurs in the capacitor 608, in some embodiments. The transistor 612 is coupled to the capacitor 608. The capacitor 608 is coupled to ground 610. A node 606 is located between the transistor 612 and the capacitor 608 in some embodiments. The node 606 is connected to the second logic gate 622. In some embodiments, the node 606 provides a signal to the second logic gate 622. The signal provided to the second logic gate 622 corresponds to a detection associated with the capacitor 608 that determines whether the capacitor 608 is functioning properly or has a defect in some embodiments. In such some embodiments, the signal provided to the second logic gate 622 is either at a high voltage level indicating that the detection associated with the capacitor 608 determines that the capacitor 608 is functioning properly, or at a low voltage level indicating that the detection associated with the capacitor 608 determines that the capacitor 608 has a defect. The second logic gate 622 is coupled to the first logic gate 616. In some embodiments, the first logic gate 616 provides a signal via node 614 to the transistor 612. The signal provided to the transistor 612 corresponds to whether the transistor 612 is activated or deactivated in some embodiments. In such some embodiments, the signal provided to the transistor 612 is either at a low voltage level that activates the transistor 612 when the signal provided to the second logic gate 622 is at the high voltage level, or at a high voltage level that deactivates the transistor 612 when the signal provided to the second logic gate 622 is at the low voltage level. In some embodiments, the first logic gate 616 is configured to receive a signal via path 618. The signal received via the path 618 corresponds to an initial set which is associated with activating or deactivating the transistor 612 in some embodiments. In such some embodiments, the signal received via the path 618 is either at the high voltage level that enables the first logic gate 616 to provide the signal to the transistor 612 at the low voltage level/high voltage level when the signal provided to the second logic gate 622 is at the high voltage level/low voltage level, or at a low voltage level that causes the first logic gate 616 to provide the signal to the transistor 612 at the low voltage level, thereby activating the transistor 612, regardless of whether the signal provided to the second logic gate 622 is at the low voltage level or the high voltage level, i.e., regardless of whether the capacitor 608 is functioning properly or has a defect, thereby allowing charging of the capacitor 608 prior to the detection associated with the capacitor 608 that determines whether the capacitor 608 is functioning properly or has a defect.

The thermometer detector 526 is coupled to the second electronic device 624 as well as the first electronic device 524. The thermometer detector 526 at least one of sends a signal to or receives a signal from 520 the first electronic device 524, and at least one of sends a signal to or receives a signal from 620 the second electronic device 624. In some embodiments, the thermometer detector 526 counts a first number of capacitors that are determined to have a defect. The thermometer detector 526 determines that a capacitor has a defect based upon an input received by the thermometer detector 526 from the capacitor. In some embodiments, an input of 0 indicates that the capacitor does not have a defect, while an input of 1 indicates that the capacitor does have a defect. It is appreciated that in some embodiments, an electronic device is determined to not have a defect if a capacitor that is part of the electronic device does not have a defect, while the electronic device is determined to have a defect if the capacitor that is part of the electronic device does have a defect. In some embodiments, the thermometer detector 526 receives a first input from the first electronic device 524, where the first input is 0. Based upon the first input, the thermometer detector determines that the first electronic device 524 and the capacitor 508 that is part of the first electronic device 524 does not have a defect. In some embodiments, the thermometer detector 526 receives a second input from the second electronic device 624, where the second input is 1. Based upon the second input, the thermometer detector determines that the second electronic device 624 and the capacitor 608 that is part of the second electronic device 624 does have a defect.

Figure 7:
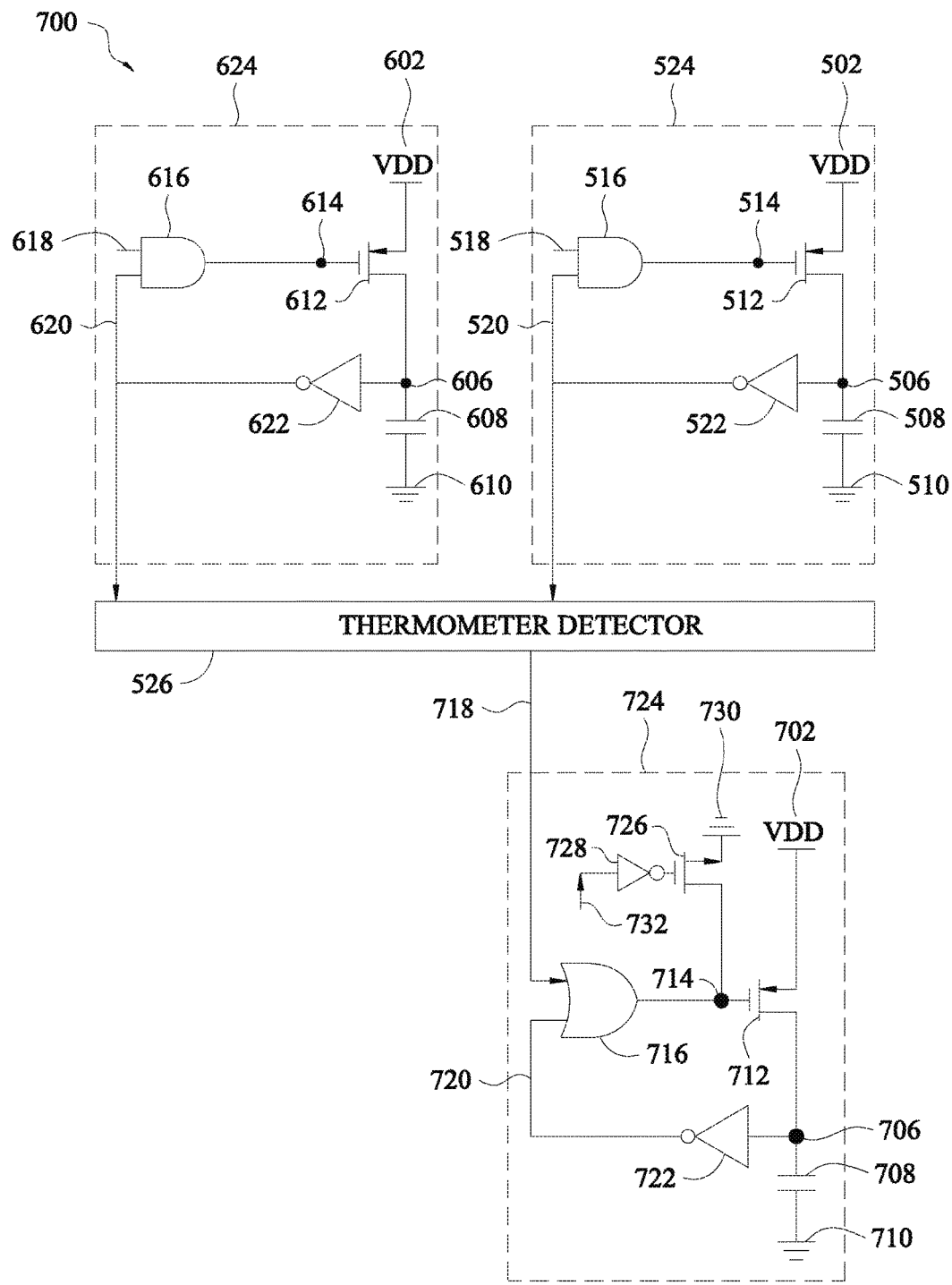
FIG. 7 is an illustration of the fifth exemplary embodiment of a system according to some embodiments.

A system 700 comprising the first electronic device 524 illustrated in FIG. 5 and FIG. 6, the thermometer detector 526 illustrated in FIG. 5 and FIG. 6, the second electronic device 624 illustrated in FIG. 6, and a third electronic device 724, according to some embodiments, is illustrated at least in part in FIG. 7.

The third electronic device 724 comprises a capacitor 708, a transistor 712, a first logic gate 716 and a second logic gate 722, and is coupled to a voltage source 702. The first logic gate 716 comprises an OR logic gate in some embodiments. The second logic gate 722 comprises a NOT logic gate in some embodiments. The voltage source 702 is coupled to the transistor 712. The transistor 712 is configured to be activated when the capacitor 708 is functioning properly and deactivated when a defect, e.g., a leakage current or a short, occurs in the capacitor 708, in some embodiments. The transistor 712 is coupled to the capacitor 708. The capacitor 708 is coupled to ground 710. A node 706 is located between the transistor 712 and the capacitor 708 in some embodiments. The node 706 is connected to the second logic gate 722. In some embodiments, the node 706 provides a signal to the second logic gate 722. The signal provided to the second logic gate 722 corresponds to a detection associated with the capacitor 708 that determines whether the capacitor 708 is functioning properly or has a defect in some embodiments. In such some embodiments, the signal provided to the second logic gate 722 is either at a high voltage level indicating that the detection associated with the capacitor 708 determines that the capacitor 708 is functioning properly, or at a low voltage level indicating that the detection associated with the capacitor 708 determines that the capacitor 708 has a defect. The second logic gate 722 is coupled to the first logic gate 716. In some embodiments, the first logic gate 716 provides a signal via node 714 to the transistor 712. The signal provided to the transistor 712 corresponds to whether the transistor 712 is activated or deactivated in some embodiments. In such some embodiments, the signal provided to the transistor 712 is either at the low voltage level that activates the transistor 712 when the signal provided to the second logic gate 722 is at the high voltage level, or at the high voltage level that deactivates the transistor 712 when the signal provided to the second logic gate 722 is at the low voltage level. In some embodiments, the first logic gate 716 is configured to receive a signal via path 718. The signal received via the path 718 corresponds to an initial set which is associated with activating or deactivating the transistor 712 in some embodiments. In such some embodiments, the signal received via the path 718 is either at the low voltage level that enables the first logic gate 716 to provide the signal to the transistor 712 at the low voltage level/high voltage level when the signal provided to the second logic gate 722 is at the high voltage level/low voltage level, or at the high voltage level that causes the first logic gate 716 to provide the signal to the transistor 712 at the high voltage level, thereby deactivating the transistor 712, regardless of whether the signal provided to the second logic gate 722 is at the low voltage level or the high voltage level, i.e., regardless of whether the capacitor 708 is functioning properly or has a defect. The node 714 is coupled to a second transistor 726 that in this embodiment is an nMOSFET. In an alternative embodiment, the second transistor 726 is a pMOSFET, an IGBT, a BJT, a FET, or any suitable transistor, so long as it functions as intended. The second transistor 726 is coupled to ground 730. The second transistor 726 is further coupled to a third logic gate 728 in some embodiments. The third logic gate 728 comprises a NOT logic gate in some embodiments. In some embodiments, the third logic gate 728 is configured to receive a signal via path 732. The signal received via the path 732 corresponds to a set which is associated with activating or deactivating the transistor 726 in some embodiments. In such some embodiments, the signal received via the path 732 is either at the high voltage level that enables the first logic gate 716 to provide the signal to the transistor 712 at the low voltage level/high voltage level when the signal provided to the second logic gate 722 is at the high voltage level/low voltage level, or at the low voltage level that activates the transistor 712, regardless of whether the signal provided to the second logic gate 722 is at the low voltage level or the high voltage level, i.e., regardless of whether the capacitor 708 is functioning properly or has a defect, thereby allowing charging of the capacitor 708 prior to the detection associated with the capacitor 708 that determines whether the capacitor 708 is functioning properly or has a defect.

The thermometer detector 526 is coupled to the third electronic device 724 as well as the second electronic device 624 and the first electronic device 524. The thermometer detector 526 at least one of sends a signal to or receives a signal from 520 the first electronic device 524, and at least one of sends a signal to or receives a signal from 620 the second electronic device 624. In some embodiments, the thermometer detector 526 counts a first number of capacitors that are determined to have a defect. The thermometer detector 526 determines that a capacitor has a defect based upon an input received by the thermometer detector 526 from the capacitor. In some embodiments, an input of 0 indicates that the capacitor does not have a defect, while an input of 1 indicates that the capacitor does have a defect. It is appreciated that in some embodiments, an electronic device is determined to not have a defect if a capacitor that is part of the electronic device does not have a defect, while the electronic device is determined to have a defect if the capacitor that is part of the electronic device does have a defect. In some embodiments, the thermometer detector 526 receives a first input from the first electronic device 524, where the first input is 0. Based upon the first input, the thermometer detector determines that the first electronic device 524 and the capacitor 508 that is part of the first electronic device 524 does not have a defect. In some embodiments, the thermometer detector 526 receives a second input from the second electronic device 624, where the second input is 1. Based upon the second input, the thermometer detector determines that the second electronic device 624 and the capacitor 608 that is part of the second electronic device 624 does have a defect.

In some embodiments, the thermometer detector 526 provides a first output or a second output based upon the first number of capacitors that are determined to have a defect. The first output is 0 and the second output is 1, in some embodiments. In some embodiments, based upon the determination that the second electronic device 624 and the capacitor 608 that is part of the second electronic device 624 does have a defect, the thermometer detector 526 provides the first output to the first logic gate 716 via the path 718. Based upon the first output, the transistor 712 is activated and the capacitor 708 is turned on. If the second electronic device 624 and the capacitor 608 that is part of the second electronic device 624 were determined to not have a defect, it is appreciated that the thermometer detector 526 would provide the second output to the first logic gate 716 via the path 718. Based upon the second output, the transistor 712 would be deactivated and the capacitor 708 would be turned off. It is appreciated that in some embodiments, after the capacitor 708 has been turned on, responsive to determining that the third electronic device 724 or the capacitor 708 has a defect, the thermometer detector 526 is configured to provide the second output to the first logic gate 716 via the path 718 to deactivate the transistor 712 and to turn off the capacitor 708.

It is appreciated that in some embodiments, the thermometer detector 526 counts a second number of capacitors comprising two or more capacitors that are determined to have a defect. The thermometer detector 526 turns on a number of other capacitors, where the number of other capacitors turned on by the thermometer detector 526 corresponds to the second number of capacitors that are determined to have a defect. In some embodiments, if the thermometer detector 526 counts a first capacitor and a second capacitor as having a defect, the thermometer detector 526 turns on a third capacitor and a fourth capacitor. The thermometer detector turns on the third capacitor by providing a first output to a first logic gate that is part of an electronic device comprising the third capacitor, and turns on the fourth capacitor by providing the first output to a second logic gate that is part of a second electronic device comprising the fourth capacitor. In some embodiments, the first output is 0, the first logic gate is an OR gate, and the second logic gate is an OR gate.

Figure 8:
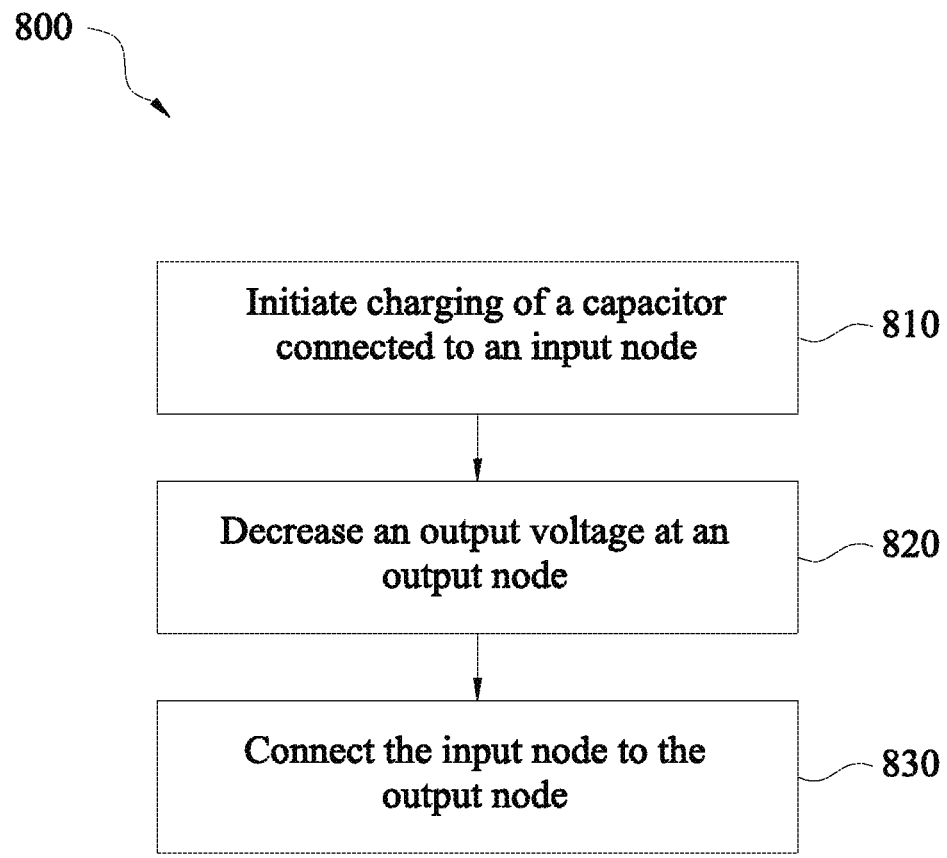
FIG. 8 is a flow diagram illustrating the third exemplary embodiment of a method according to some embodiments.

A method 800, according to some embodiments, is illustrated in FIG. 8, and systems that may be used to implement the method 800 are illustrated in FIGS. 10-13 and 15-19. In some embodiments, an input node and an output node of a system are initially electrically disconnected from each other. At block 810, charging of a capacitor of the system connected to the input node is initiated. In some embodiments, the capacitor is an HD MiM capacitor, an HD MoM capacitor, a MOSCAP, or any capacitor having a high capacitance density, e.g., greater than 2 fF/μm². At block 820, an output voltage at the output node is gradually decreased. In some embodiments, the output voltage is compared to a reference voltage and when it is determined that the output voltage decreases to less than the reference voltage, the input node is electrically connected to the output node at block 830, thereby increasing or boosting the output voltage. Thereafter, the output voltage again gradually decreases.

Figure 9:
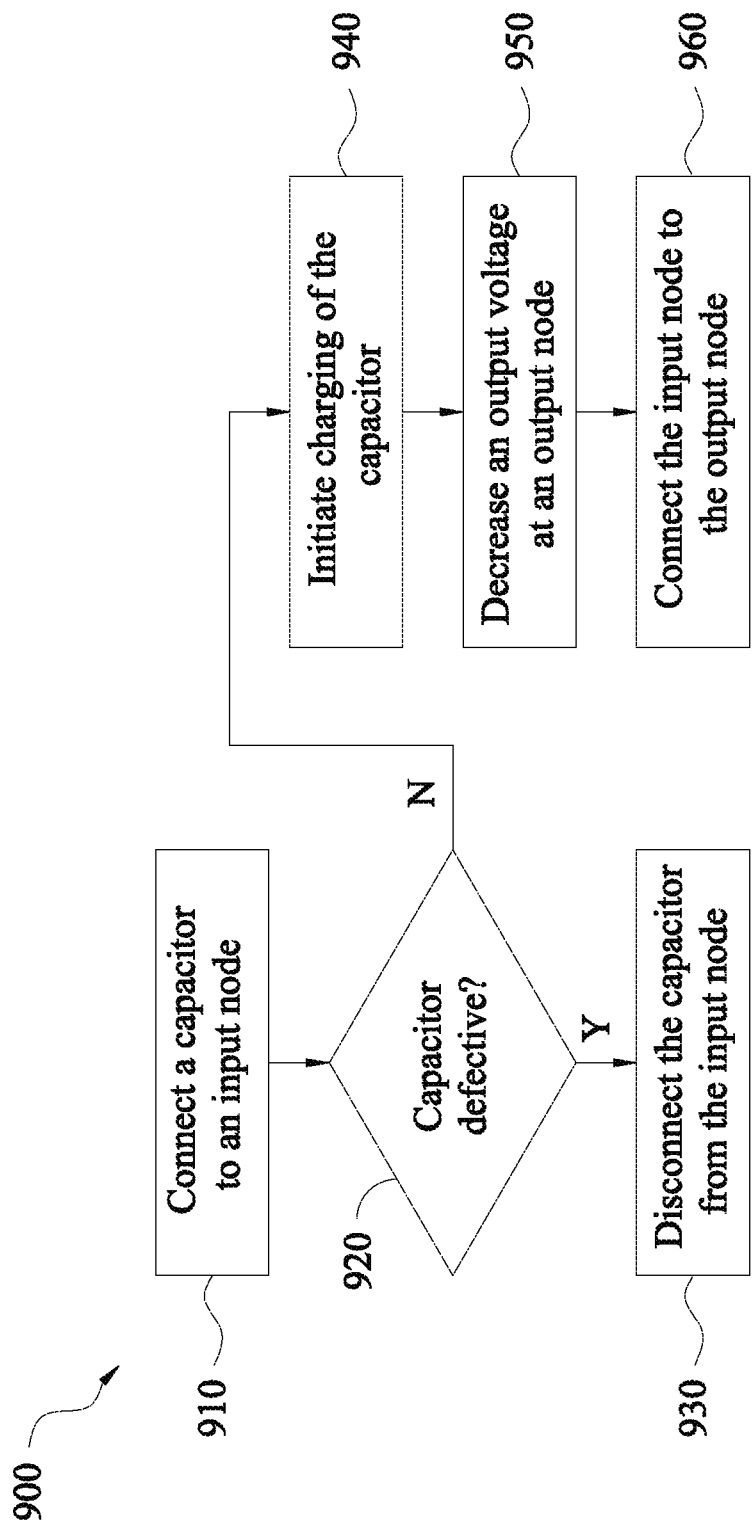
FIG. 9 is a flow diagram illustrating the fourth exemplary embodiment of a method according to some embodiments.

A method 900, according to some embodiments, is illustrated in FIG. 9, and systems that may be used to implement the method 900 are illustrated in FIGS. 15-19. In some embodiments, an input node and an output node of a system are initially electrically disconnected from each other. At block 910, a capacitor of the system is electrically connected to the input node. In some embodiments, the capacitor is an HD MiM capacitor, an HD MoM capacitor, a MOSCAP, or any capacitor having a high capacitance density, e.g., greater than 2 fF/μm². At block 920, it is detected whether the capacitor is defective, e.g., possessing a leakage of a current or a short. When it is determined that the capacitor is not defective, the flow proceeds to block 940. Otherwise, i.e., when the capacitor is determined to be defective, the capacitor is electrically disconnected from the input node at block 930 and the flow is terminated. At block 940, charging of the capacitor is initiated. At block 950, an output voltage at the output node is gradually decreased. In some embodiments, the output voltage is compared to a reference voltage and when it is determined that the output voltage decreases to less than the reference voltage, the input node is electrically connected to the output node at block 960, thereby increasing or boosting the output voltage. Thereafter, the output voltage again gradually decreases.

Figure 10:
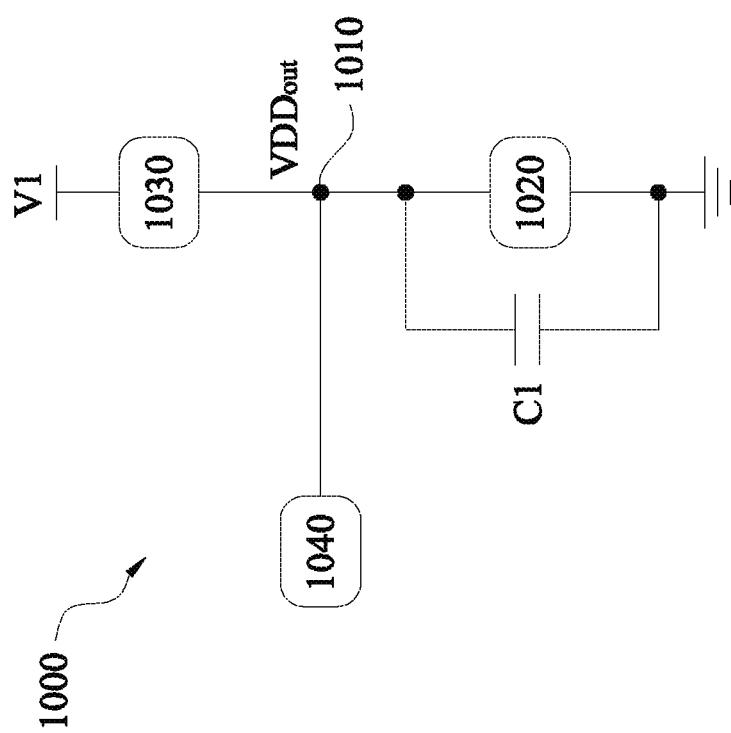
FIG. 10 is an illustration of the sixth exemplary embodiment of a system according to some embodiments.

A system 1000, according to some embodiments, is illustrated in FIG. 10. The system 1000 includes an output node 1010, a load unit 1020, a capacitor (C1), a distribution network 1030, and a droop compensating mechanism 1040. The load unit 1020 is connected between the output node 1010 and a ground. In some embodiments, the load unit 1020 operates at a very high switching speed, e.g., 10 MHz to 10 GHz, and includes a memory, such as a volatile memory, e.g., a static random access memory (SRAM) or a dynamic RAM (DRAM), and a non-volatile memory, e.g., a read-only memory (ROM), a flash memory, or a ferroelectric RAM (FERAM). The capacitor (C1) is connected across, i.e., in parallel to, the load unit 1020. The distribution network 1030 includes a plurality of wirings and is configured to electrically connect the output node 1010 to a supply voltage (V1), whereby an output voltage (VDDout) appears at the output node 1010.

Figure 14:
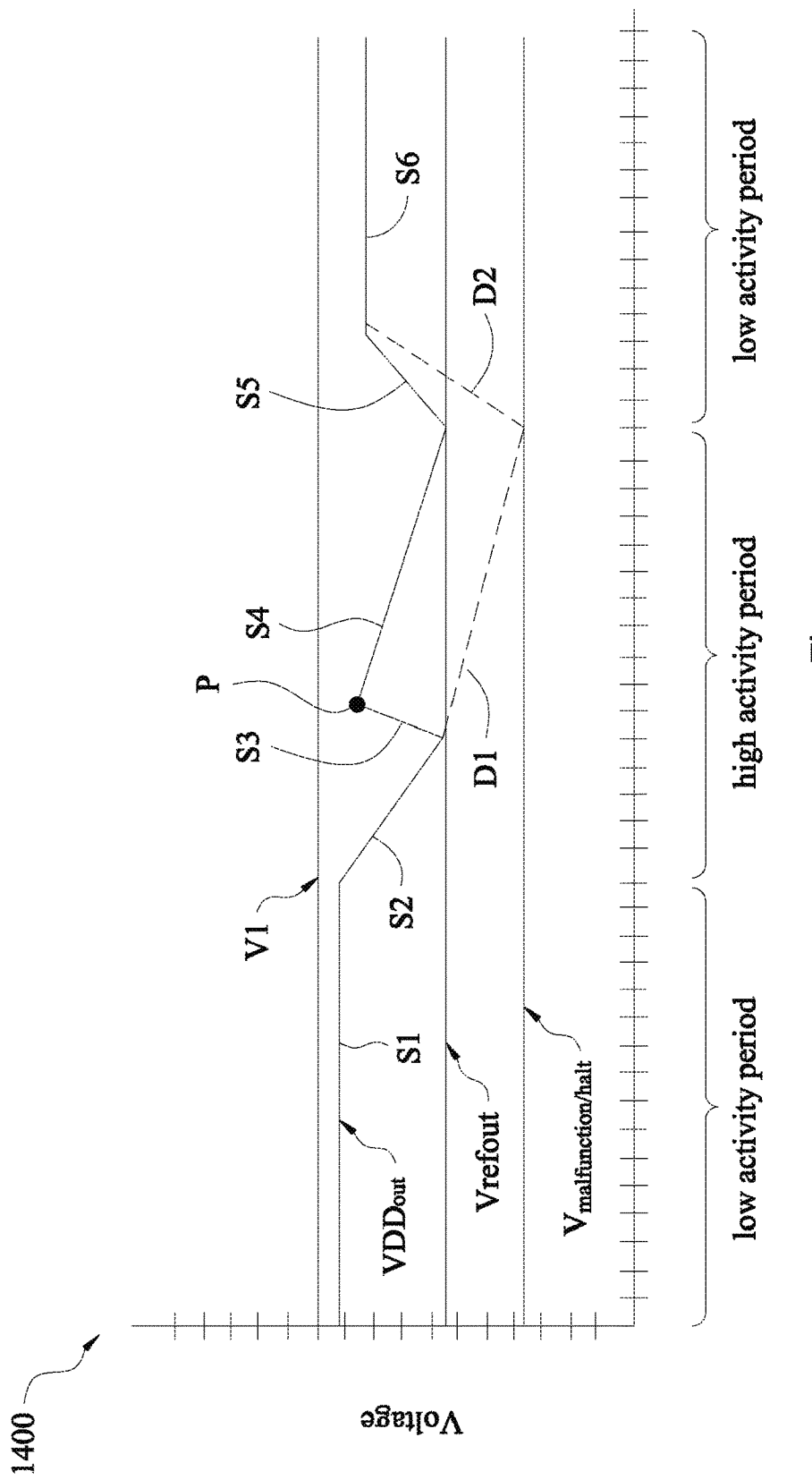
FIG. 14 is a timing diagram illustrating an operation associated with the system of FIG. 12 according to some embodiments.

A timing diagram 1400, according to some embodiments, associated with the operation of the system 1000 is illustrated in FIG. 14. In operation, as shown in FIG. 14, during a period of low activity in which the load unit 1020 is operating at a relatively slow switching speed, e.g., less than about 1 GHz, the output voltage (VDDout) indicated as line (VDDout) has a substantially constant value, as indicated by segment (S1) of the line (VDDout), e.g., less than about the supply voltage (V1) indicated as line (V1). Conversely, during a period of high activity in which the load unit 1020 operates at a relatively fast switching speed, e.g., greater than about 1 GHz, the load unit 1020 draws a large load current that may cause the output voltage (VDDout) to abruptly decrease or droop, i.e., in the absence of the capacitor (C1). The capacitor (C1) serves to lengthen a duration of the droop, thereby causing a gradual, rather than an abrupt, decrease in the output voltage (VDDout), as indicated by segment (S2) of the line (VDDout). When the output voltage (VDDout) droops too low, e.g., below 0.1 V less than the supply voltage (V1), as indicated by segment (D1) of dotted line, and to line ($V_{malfunction/halt}$), the load unit 1020 may malfunction, e.g., the load unit 1020 writes a "1" in a memory cell thereof when it is supposed to write a "0" or vice versa, or halt its operation. Thereafter, when the load unit 1020 does not halt and transitions from the high activity period back to the low activity period, the output voltage (VDDout) gradually increases, as indicated by segment (D2) of the dotted line, to a substantially constant value, as indicated by segment (S6) of the line (VDDout).

Figure 11:
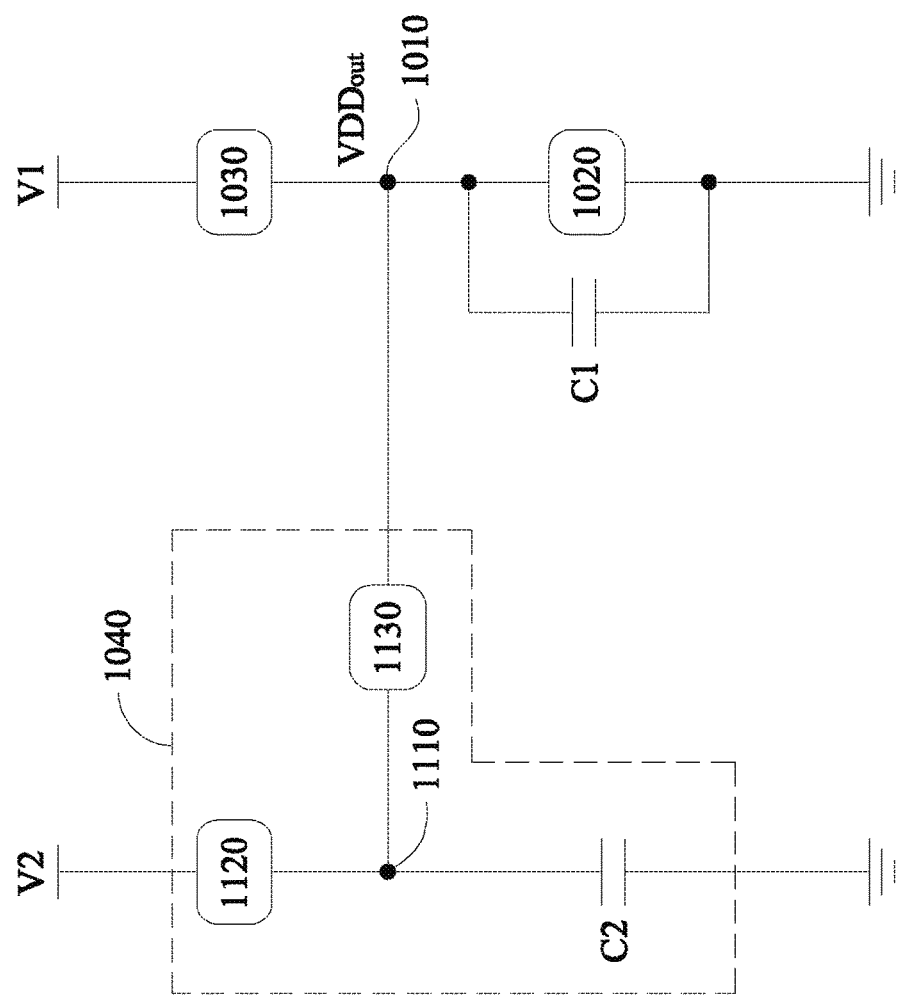
FIG. 11 is an illustration of a droop compensating mechanism of the system of FIG. 10 according to some embodiments.

The droop compensating mechanism 1040, according to some embodiments, is illustrated in FIG. 11. The droop compensating mechanism 1040 includes an input node 1110, a capacitor (C2), a capacitor charger 1120, and a voltage booster 1130.

The capacitor (C2) is connected between the input node 1110 and the ground. The capacitor charger 1120 is connected to the input node 1110 and is configured to charge the capacitor (C2), in a manner that will be described hereinafter.

Figure 12:
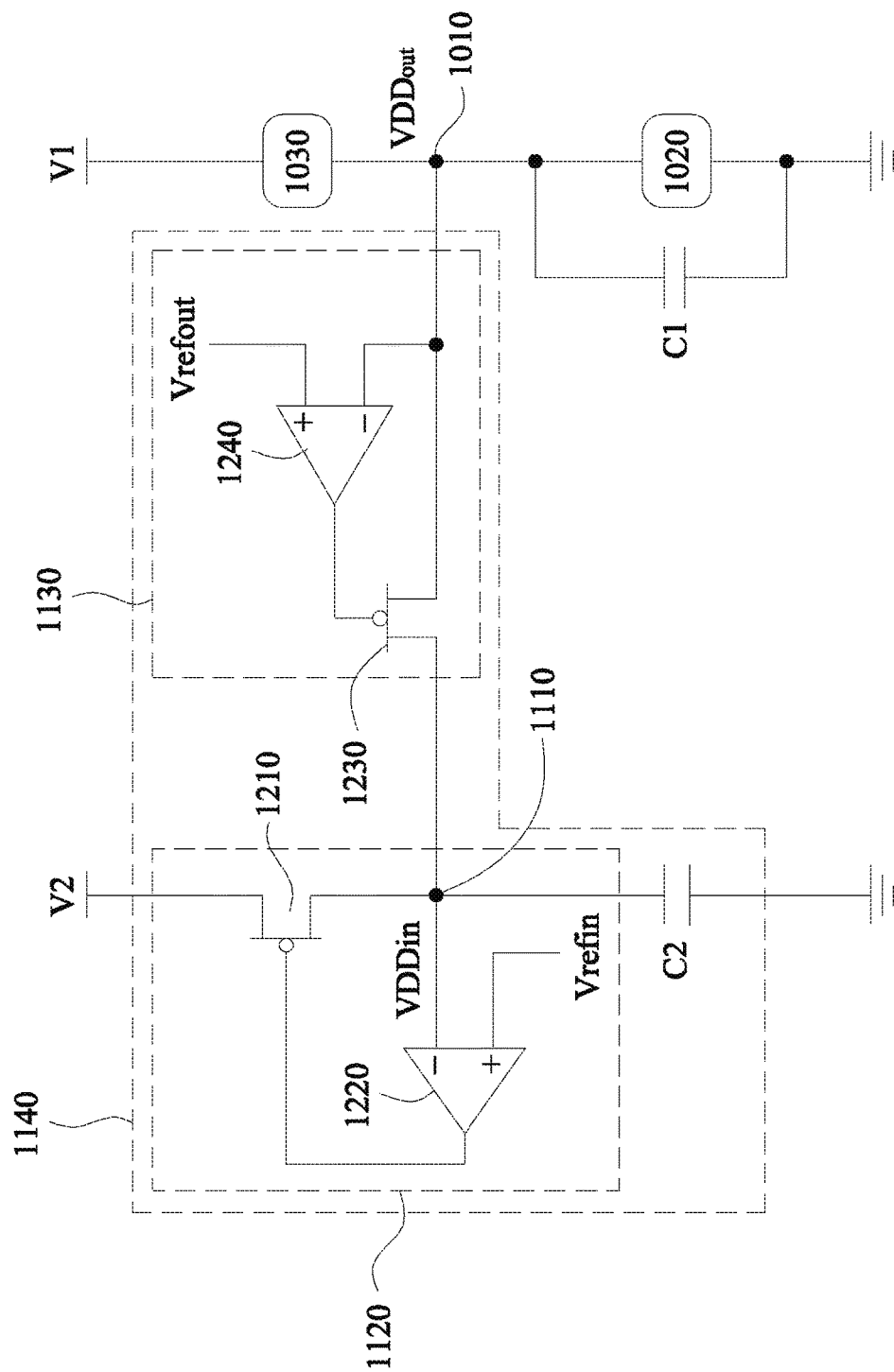
FIG. 12 is an illustration of a capacitor, a capacitor charger, and a voltage booster of the droop compensating mechanism of FIG. 11 according to some embodiments.

The capacitor charger 1120, according to some embodiments, is illustrated in FIG. 12. The capacitor charger 1120 includes a switch 1210 and a comparator 1220. The switch 1210 is connected to the input node 1110 and is configured to electrically connect a supply voltage (V2) to the input node 1110 when activated, whereby an input voltage (VDDin) appears at the input node 1110, and is further configured to electrically disconnect the supply voltage (V2) from the input node 1110 when deactivated. The input voltage (VDDin), as will be described in detail below, serves to boost or increase the output voltage (VDDout). Therefore, the supply voltage (V2) may be substantially equal to or greater than the supply voltage (V1) but not less than the output voltage (VDDout). In some embodiments, the switch 1210 includes a transistor, e.g., a pMOSFET, and has a first source/drain terminal connected to the input node 1110, a second source/drain terminal to which the supply voltage (V2) is applied, and a gate terminal. In other embodiments, the transistor is an nMOSFET, an IGBT, a BJT, a FET, or any suitable transistor, so long as it functions as intended. The comparator 1220 is connected to the input node 1110 and the switch 1210 and is configured to activate and deactivate the switch 1210 with reference to the input voltage (VDDin). In some embodiments, the comparator 1220 includes an operational amplifier (op-amp) and has an inverting input terminal connected to the input node 1110, a non-inverting input terminal to which a reference voltage (Vrefin), e.g., less than about the supply voltage (V2), is applied, and an output terminal connected to the gate terminal of the switch 1210.

In operation, when the input voltage (VDDin) is initially less than the reference voltage (Vrefin), the comparator 1220 generates at the output terminal thereof a voltage level, e.g., a low voltage level. This causes activation of the switch 1210. This, in turn, initiates charging of the capacitor (C2), thereby increasing the input voltage (VDDin). When the input voltage (VDDin) increases to greater than the reference voltage (Vrefin), the comparator 1220 generates at the output terminal thereof a voltage level, e.g., a high voltage level. This causes deactivation of the switch 1210. This, in turn, terminates the charging of the capacitor (C2).

The voltage booster 1130, according to some embodiments, is illustrated in FIG. 12. The voltage booster 1130 includes a switch 1230 and a comparator 1240. The switch 1230 is connected between the input and output nodes 1110, 1010 and is configured to electrically connect the input and output nodes 1110, 1010 to each other when activated and to electrically disconnect the input and output nodes 1110, 1010 from each other when deactivated. In some embodiments, the switch 1230 includes a transistor, e.g., a pMOSFET, and has a first source/drain terminal connected to the input node 1110, a second source/drain terminal connected to the output node 1010, and a gate terminal. In other embodiments, the transistor is an nMOSFET, an IGBT, a BJT, a FET, or any suitable transistor, so long as it functions as intended. The comparator 1240 is connected to the output node 1010 and the switch 1230 and is configured to activate and deactivate the switch 1230 with reference to the output voltage (VDDout). In some embodiments, the comparator 1240 includes an op-amp and has an inverting input terminal connected to the output node 1010, a non-inverting input terminal to which a reference voltage (Vrefout), e.g., about 0.1 V less than the supply voltage (V1), is applied, and an output terminal connected to the gate terminal of the switch 1230.

In this embodiment, the supply voltage (V1) is, e.g., about 0.8 V, the supply voltage (V2) is, e.g. 10%, greater than the supply voltage (V1), i.e., about 0.88 V, the reference voltage (Vrefout) is, e.g., about 0.7 V, and the reference voltage (Vrefin) is, e.g., less than about 0.88 V.

In operation, as shown in FIG. 14, when the load unit 1020 transitions from the low activity period to the high activity period, the output voltage (VDDout) gradually decreases, as indicated by the segment (S2). When the output voltage (VDDout) decreases to less than the reference output voltage (Vrefout) indicated as line (Vrefout), the comparator 1240 generates at the output terminal thereof a voltage level, e.g., a low voltage level. This causes activation of the switch 1230, thereby electrically connecting the input node 1110 to the output node 1010. This, in turn, increases or boosts the output voltage (VDDout), as indicated by segment (S3) of the line (VDDout), to point (P). In this instance, the output voltage (VDDout) may be calculated as $$VDDout = V2 + \frac{C2*\Delta V1 - C2*\Delta V2}{C1+C2}$$

where ΔV1=V1−Vrefout and ΔV2=V2−Vrefin.

Thereafter, as shown in FIG. 14, the output voltage (VDDout) again gradually decreases, as indicated by segment (S4) of the line (VDDout), and subsequently increases again, as indicated by segment (S5) of the line (VDDout), to a substantially constant value, as indicated by the segment (S6), i.e., when the load unit 1020 transitions from the high activity period back to the low activity period.

From the above description, as shown in FIG. 14, by virtue of the droop compensating mechanism 1140, the output voltage (VDDout) of the system 1000 of the present disclosure is ensured to be well above a voltage, as indicated by the line ($V_{malfunction/halt}$), to which the output voltage (VDDout) may droop, e.g., in the absence of the droop compensating mechanism 1140, and at which the load unit 1020 may malfunction or halt.

Figure 13:
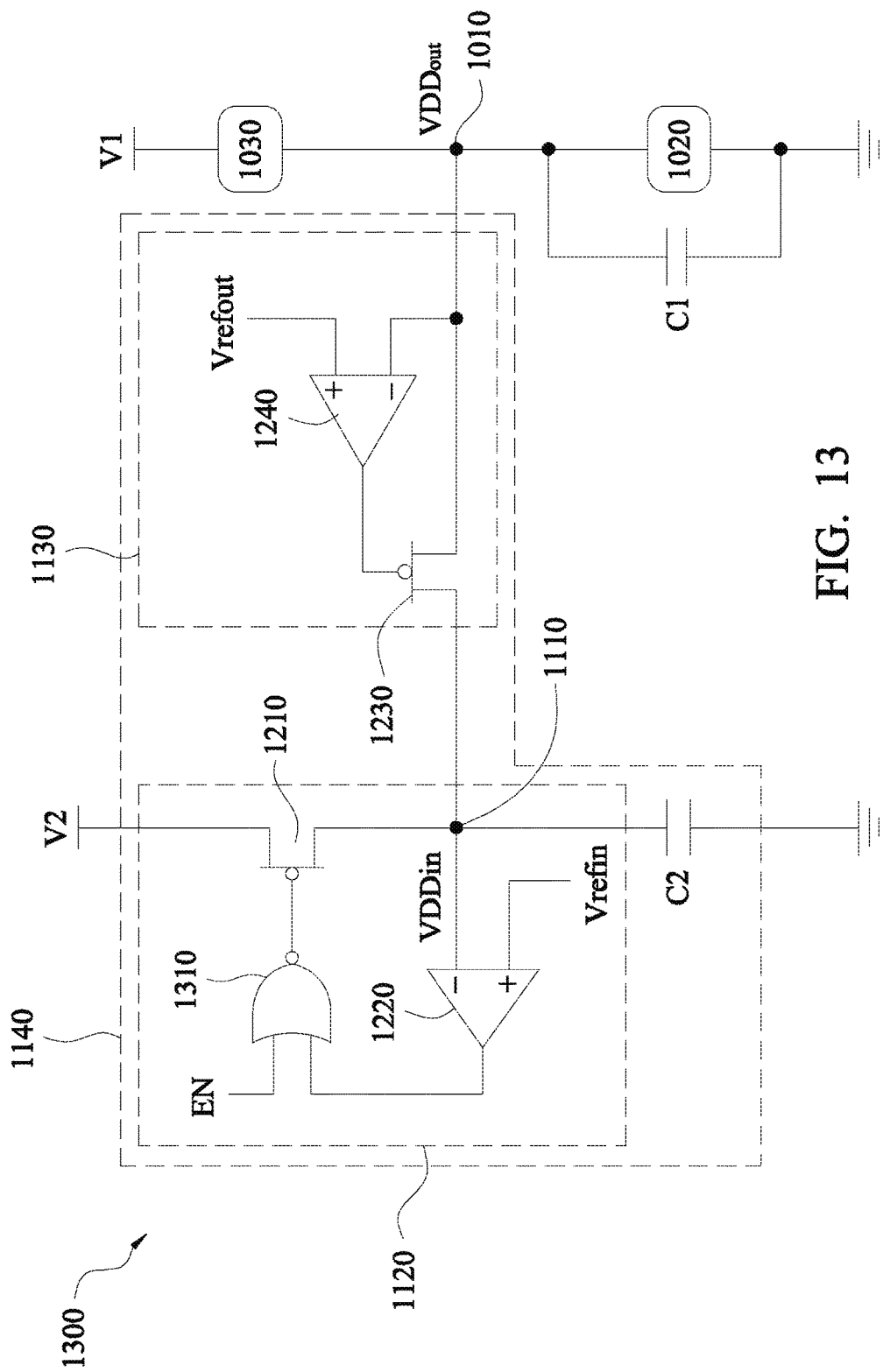
FIG. 13 is an illustration of the seventh exemplary embodiment of a system according to some embodiments.

A system 1300, according to some embodiments, is illustrated in FIG. 13. The system 1300 differs from the system of FIG. 12 in that the droop compensating mechanism 1140 further includes a switch activation-preventing device 1310 connected between the comparator 1220 and the switch 1210 and configured to prevent the switch 1210 from being activated by the comparator 1220 when enabled. In some embodiments, the switch activation-preventing device 1310 includes a logic gate, e.g., a NOR gate, and has a first input terminal (EN), a second input terminal connected to the output terminal of the comparator 1220, and an output terminal connected to the gate terminal of the switch 1210. The construction as such permits not only operation of the capacitor charger 1120 as described above with respect to FIG. 12 by applying a low voltage level to the first input terminal (EN) to thereby disable the switch activation-preventing device 1310, but also inhibition of charging of the capacitor (C2) by the capacitor charger 1120, e.g., in the event of the capacitor (C2) becoming defective, by applying a high voltage level to the first input terminal (EN) to thereby enable the switch activation-preventing device 1310.

Figure 15:
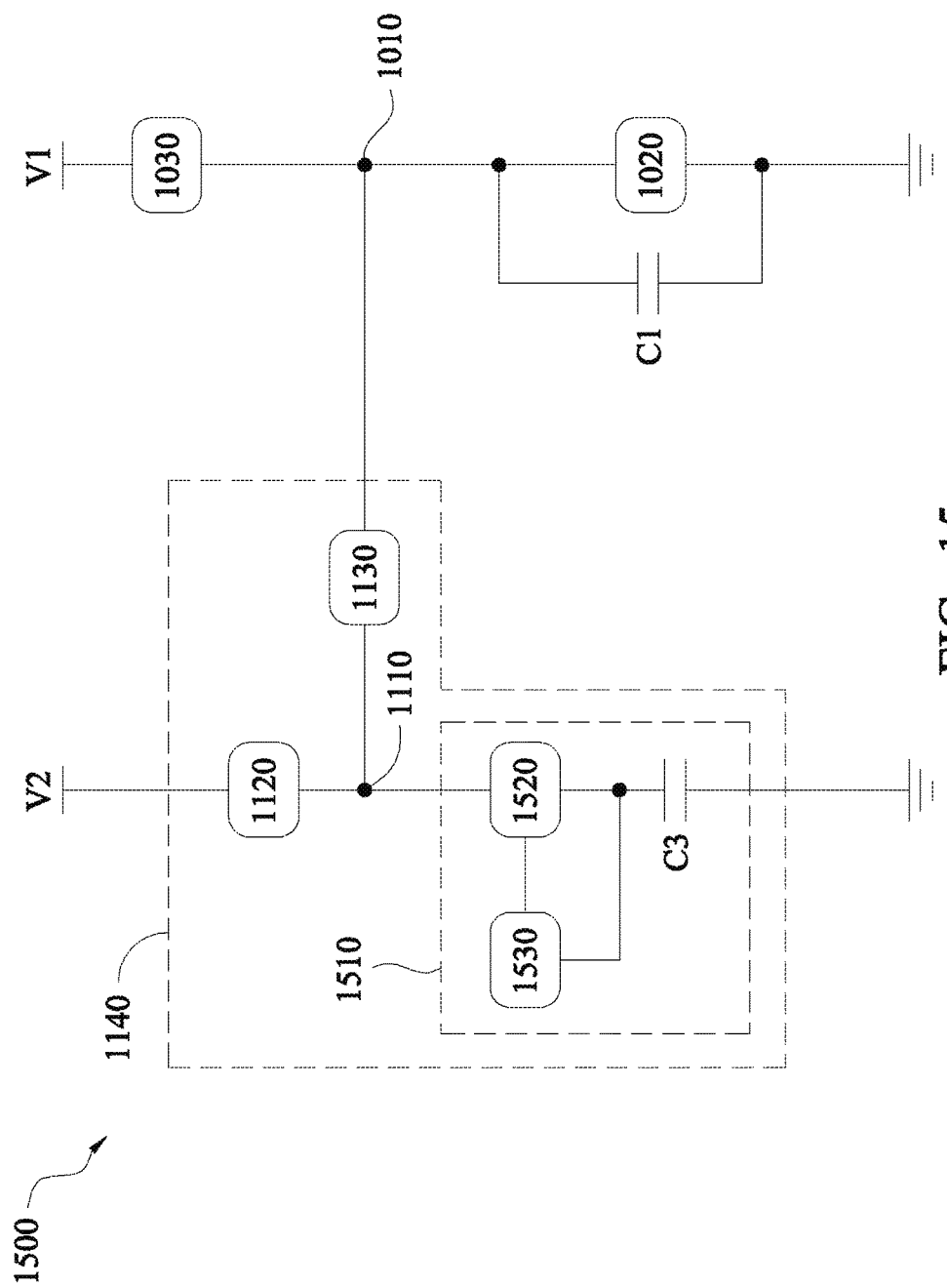
FIG. 15 is an illustration of the eighth exemplary embodiment of a system according to some embodiments.

A system 1500, according to some embodiments, is illustrated in FIG. 15. When compared to the system illustrated in FIG. 11, the capacitor (C2) is dispensed with. The system 1500 further includes a subsystem 1510 that includes a capacitor (C3), a switch 1520, and a detector 1530. The capacitor (C3) is connected to the ground. The switch 1520 is connected between the input node 1110 and the capacitor (C3) and is configured to electrically connect/disconnect the capacitor (C3) to/from the input node 1110 when activated/deactivated. The detector 1530 is connected to a junction of the switch 1520 and the capacitor (C3), is further connected to the switch 1520, and is configured to detect whether the capacitor (C3) is defective and to activate/deactivate the switch 1520 based on the result of the detection. In other embodiments, the capacitor (C3), the switch 1520, and the detector 1530 of the subsystem 1510 are substantially and respectively the same as the capacitor 308, the switch 304, and the device 314 of the system 300 illustrated in FIG. 3A or the capacitor 328, the transistor 332, and the logic gates 336, 342 of the system 350 illustrated in FIG. 3B.

Figure 16:
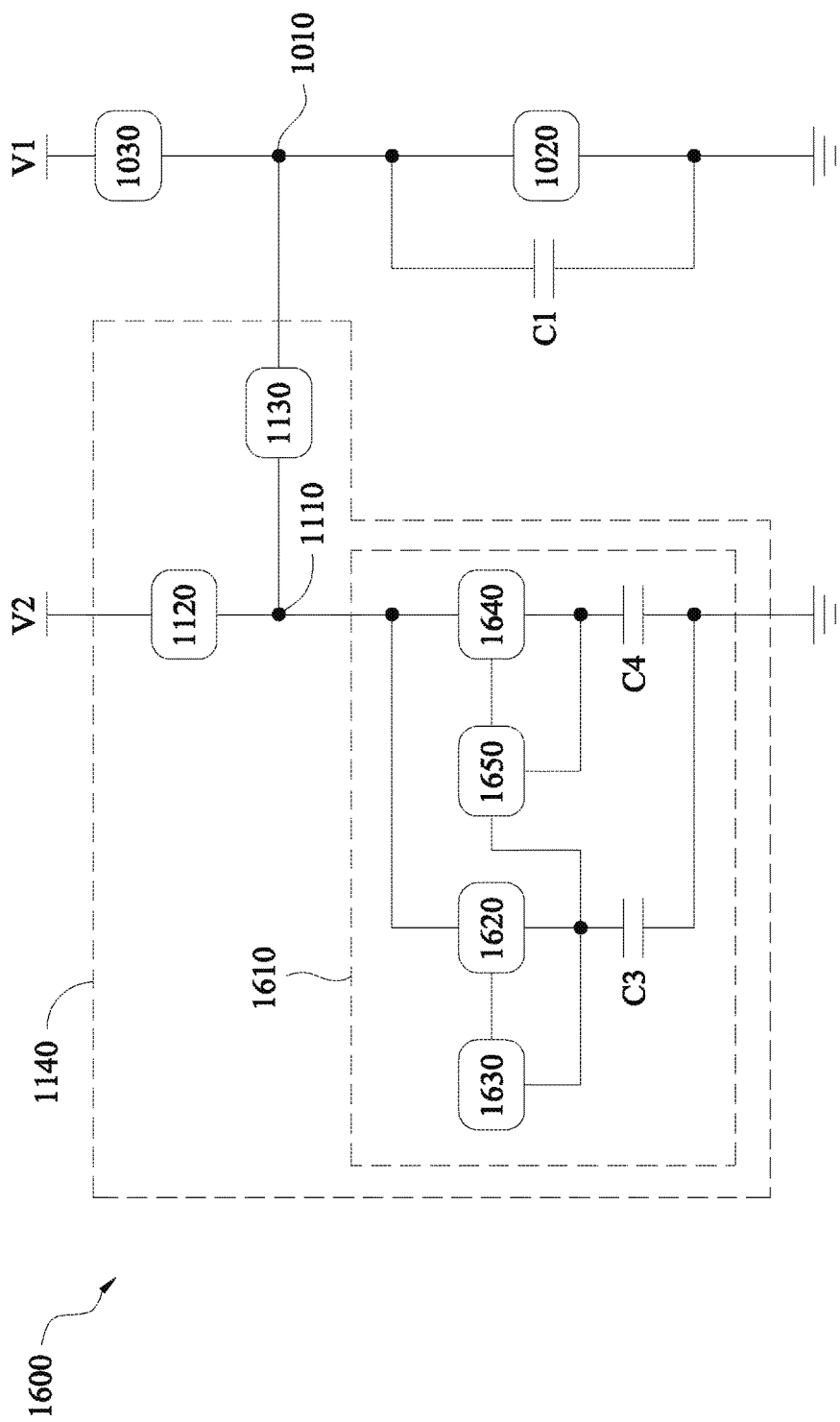
FIG. 16 is an illustration of the ninth exemplary embodiment of a system according to some embodiments.

A system 1600, according to some embodiments, is illustrated in FIG. 16. When compared to the system illustrated in FIG. 11, the capacitor (C2) is dispensed with. The system 1600 further includes a subsystem 1610 that includes a pair of capacitors (C3, C4), a pair of switches 1620, 1640, and a pair of detectors 1630, 1650. Each of the capacitors (C3, C4) is connected to the ground. Each of the switches 1620, 1640 is connected between the input node 1110 and a respective one of the capacitors (C3, C4) and is configured to electrically connect/disconnect the respective one of the capacitors (C3, C4) to/from the input node 1110 when activated/deactivated. Each of the detectors 1630, 1650 is connected to a junction of the switch 1620 and the capacitor (C3), is further connected to a respective one of the switches 1620, 1640, and is configured to detect whether the capacitor (C3) is defective and to activate/deactivate the respective one of the switches 1620, 1640 based on the result of the detection thereof. The detector 1650 is further connected to a junction of the switch 1640 and the capacitor (C4) and is further configured to detect whether the capacitor (C4) is defective and to activate/deactivate the switch 1640 based on the result of the detection thereof. In other embodiments, the capacitor (C3), the switch 1620, and the detector 1630 of the subsystem 1610 are substantially and respectively the same as the capacitor 410, the switch 406, and the device 414 of the first electronic device 402 of the system 400 illustrated in FIG. 4 and the capacitor (C4), the switch 1640, and the detector 1650 of the subsystem 1610 are substantially and respectively the same as the capacitor 430, the switch 426, and the device 434 of the second electronic device 422 of the system 400 illustrated in FIG. 4.

Figure 17:
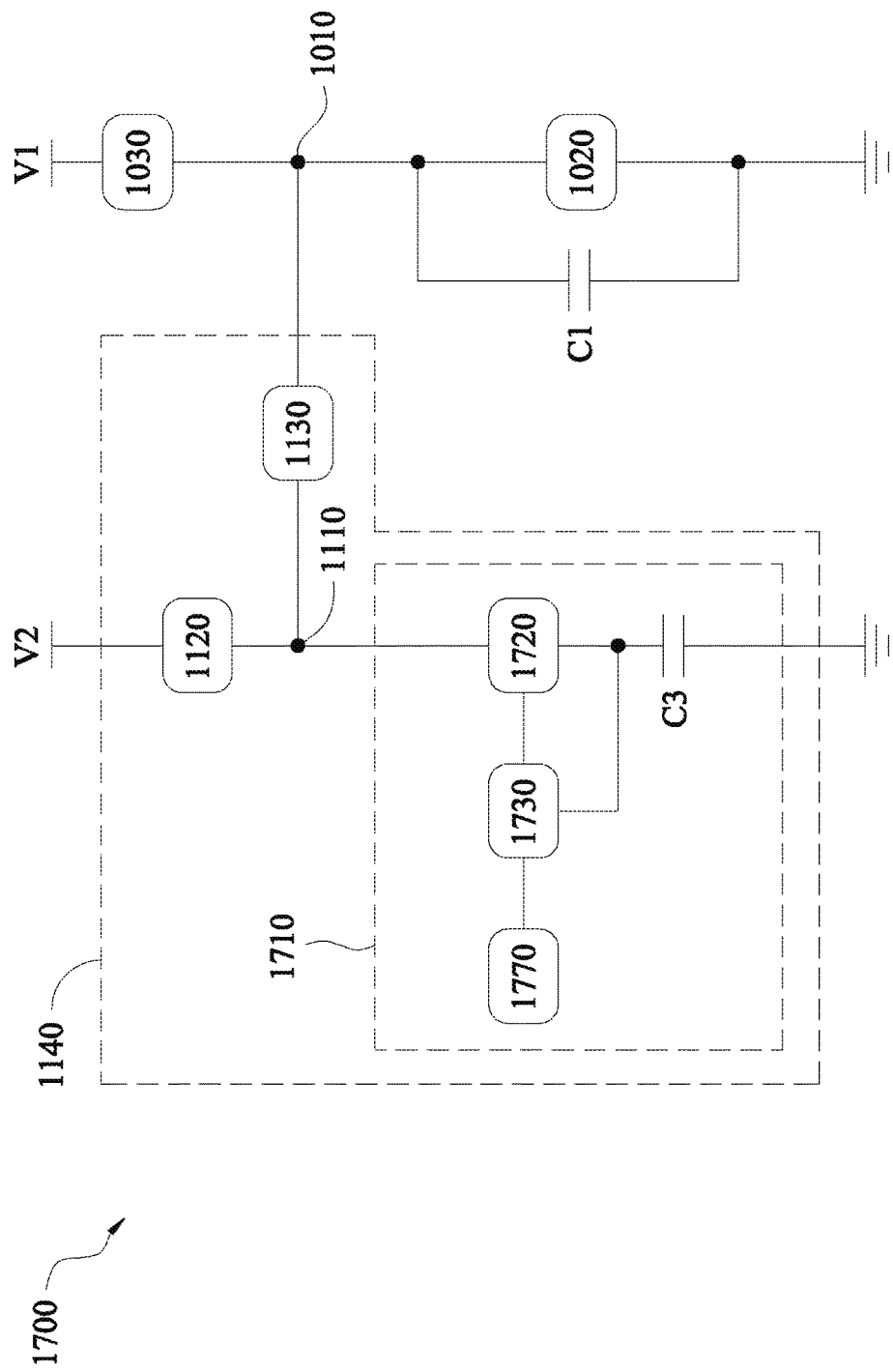
FIG. 17 is an illustration of the tenth exemplary embodiment of a system according to some embodiments.

A system 1700, according to some embodiments, is illustrated in FIG. 17. When compared to the system illustrated in FIG. 11, the capacitor (C2) is dispensed with. The system 1700 further includes a subsystem 1710 that includes a plurality of capacitors (C3), a plurality of switches 1720, a plurality of detectors 1730, and a counter 1770. For clarity of illustration, only one of the capacitors (C3), one of the switches 1720, and one of the detectors 1730 are shown in FIG. 17. The capacitor (C3) is connected to the ground. The switch 1720 is connected between the input node 1110 and the capacitor (C3) and is configured to electrically connect/disconnect the capacitor (C3) to/from the input node 1110 when activated/deactivated. The detector 1730 is connected to a junction of the switch 1720 and the capacitor (C3), is further connected to the switch 1720, and is configured to detect whether the capacitor (C3) is defective and to activate/deactivate the switch 1720 based on the result of the detection thereof. The counter 1770 is connected to the detector 1730 and is configured to detect whether the capacitor (C3) is defective and to count the number of the capacitors (C3) that are defective based on the result of the detection thereof. In other embodiments, the capacitors (C3); the switches 1720; and the detectors 1730 of the subsystem 1710 are substantially and respectively the same as the capacitors 508, 608; the transistors 512, 612; and the combination of the logic gates 516, 522 and the combination of the logic gates 616, 622 of the first and second electronic devices 524, 624 of the system 600 illustrated in FIG. 6 and the counter 1770 of the subsystem 1710 is substantially the same as the thermometer detector 526 of the system 600 illustrated in FIG. 6.

Figure 18:
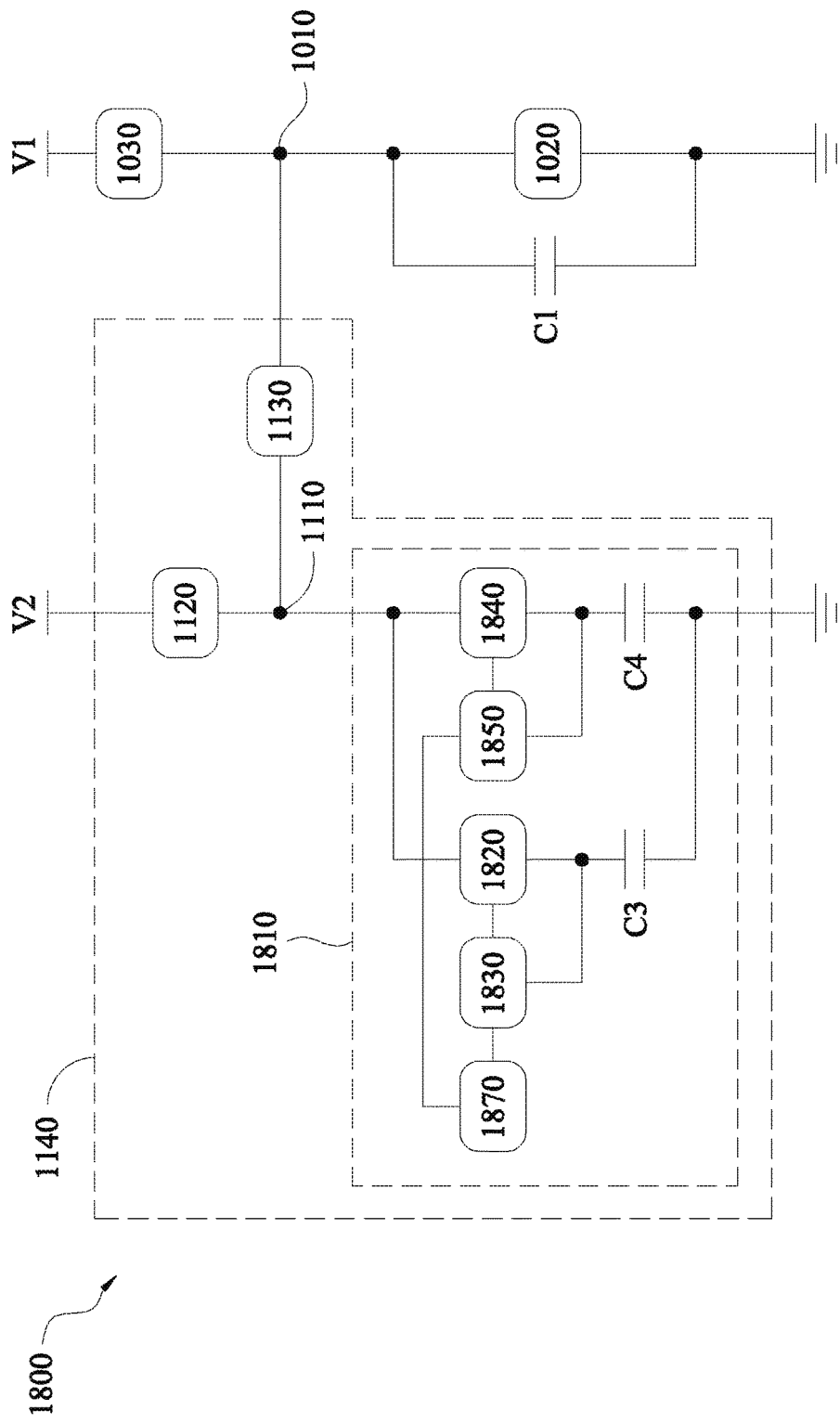
FIG. 18 is an illustration of the eleventh exemplary embodiment of a system according to some embodiments.

A system 1800, according to some embodiments, is illustrated in FIG. 18. When compared to the system illustrated in FIG. 11, the capacitor (C2) is dispensed with. The system 1800 further includes a subsystem 1810 that includes a plurality of capacitors (C3), a plurality of capacitors (C4), a plurality of switches 1820, a plurality of detectors 1830, a plurality of switches 1840, a plurality of detectors 1850, and a counter 1870. For clarity of illustration, only a pair of the capacitors (C3, C4), a pair of the switches 1820, 1840, and a pair of the detectors 1830, 1850 are shown in FIG. 18. Each of the capacitors (C3, C4) is connected to the ground. Each of the switches 1820, 1840 is connected between the input node 1110 and a respective one of the capacitors (C3, C4) and is configured to electrically connect/disconnect the respective one of the capacitors (C3, C4) to/from the input node 1110 when activated/deactivated. Each of the detectors 1830, 1850 is connected to a junction of a respective one of the switches 1820, 1840 and a respective one of the capacitors (C3, C4) and is configured to detect whether the respective one of the capacitors (C3, C4) is defective and to activate/deactivate the respective one of the switches 1820, 1840 based on the result of the detection thereof. The counter 1870 is connected to the detectors 1830, 1850 and is configured to detect whether the capacitors (C3) are defective, to count the first number of the capacitors (C3) that are defective based on the result of the detection thereof, and to activate a second number of the switches 1840. In some embodiments, the second number is equal to the first number. In other embodiments, the second number is greater or less than the first number. In other embodiments, the capacitors (C3); the switches 1820; and the detectors 1830 of the subsystem 1810 are substantially and respectively the same as the capacitors 508, 608; the transistors 512, 612; and the combination of the logic gates 516, 522 and the combination of the logic gates 616, 622 of the first and second electronic devices 524, 624 of the system 700 illustrated in FIG. 7. In such other embodiments, the capacitor (C4); the switch 1840; and the detector 1850 are substantially and respectively the same as the capacitor 708; the transistor 712; and the combination of the logic gates 716, 722, 728 and the transistor 726 of the third electronic device 724 of the system 700 illustrated in FIG. 7 and the counter 1870 of the subsystem 1810 is substantially the same as the thermometer detector 526 of the system 700 illustrated in FIG. 7.

Figure 19:
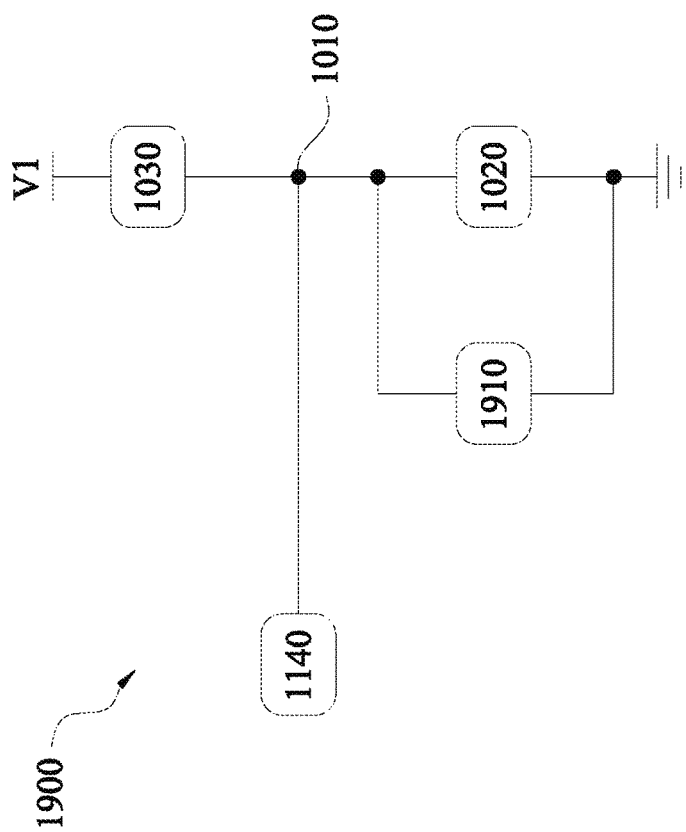
FIG. 19 is an illustration of the twelfth exemplary embodiment of a system according to some embodiments.

A system 1900, according to some embodiments, is illustrated in FIG. 19. When compared to the system 1000 illustrated in FIG. 10, the system 1900 further includes a subsystem 1910 that is connected across the load unit 1020, that includes a capacitor, i.e., the capacitor (C1) of FIG. 10, and that is configured to detect whether the capacitor (C1) is defective and to electrically disconnect the capacitor (C1) from the output node 1010 when it is determined that the capacitor (C1) is defective. In some embodiments, the subsystem 1910 is substantially the same as one of the systems 300, 350, 400, 500, 600, and 700 illustrated in FIGS. 3A, 3B, 4, 5, 6, and 7, respectively, and the subsystems 1510, 1610, 1710, and 1810 illustrated in FIGS. 15, 16, 17, and 18, respectively.

According to an aspect of the instant disclosure, a circuit is provided. The circuit comprises an output node, a first capacitor, and a droop compensating mechanism. The first capacitor is connected to the output node, The droop compensating mechanism includes an input node, a second capacitor, and a capacitor charger. The input node is connected electrically to the output node. The second capacitor is connected to the input node. The capacitor charger is connected to the input node and is configured to charge the second capacitor.

According to an aspect of the instant disclosure, a system is provided. The system comprises an output node, a load unit, a first capacitor, and a droop compensating mechanism. The load unit is connected to the output node. The first capacitor is connected across the load unit. The droop compensating mechanism includes an input node, a second capacitor, and a capacitor charger. The input node is connected electrically to the output node. The second capacitor is connected to the input node. The capacitor charger is connected to the input node and is configured to charge the second capacitor.

According to an aspect of the instant disclosure, a method is provided. The method comprises charging a capacitor connected to an input node, gradually decreasing an output voltage at an output node, and electrically connecting the input node to the output node.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A circuit comprising:
an output node;
a first capacitor connected to the output node; and
a droop compensating mechanism including
an input node connected electrically to the output node,
a second capacitor connected to the input node,
a capacitor charger connected to the input node and configured to charge the second capacitor, and
a subsystem connected to the input node that includes the second capacitor, the subsystem configured to detect whether the second capacitor is defective and to electrically disconnect the second capacitor from the input node when the second capacitor is determined to be defective.

2. The circuit of claim 1, wherein the capacitor charger includes a switch connected to the input node and configured to electrically connect a supply voltage to the input node when activated.

3. The circuit of claim 2, wherein the capacitor charger further includes a comparator connected to the input node and the switch and configured to compare an input voltage at the input node to a reference voltage and to activate and deactivate the switch based on the result of the comparison.

4. The circuit of claim 3, wherein the capacitor charger further includes a switch activation-preventing device connected between the comparator and the switch and configured to prevent the switch from being activated by the comparator when enabled.

5. The circuit of claim 1, wherein the droop compensating mechanism further includes
a switch connected between the input and output nodes and configured to electrically connect the input and output nodes to each other when activated, and
a comparator connected to the output node and the switch and configured to compare an output voltage at the output node to a reference voltage and to activate and deactivate the switch based on the result of the comparison.

6. The circuit of claim 1, wherein the subsystem further includes a third capacitor and is further configured to electrically connect the third capacitor to the input node when the second capacitor is electrically disconnected thereby from the input node.

7. A system comprising:
an output node;
a load unit connected to the output node;
a first capacitor connected across the load unit; and
a droop compensating mechanism including
an input node connected electrically to the output node,
a second capacitor connected to the input node,
a capacitor charger connected to the input node and configured to charge the second capacitor, and
a subsystem connected to the input node that includes the second capacitor, the subsystem configured to detect whether the second capacitor is defective and to electrically disconnect the second capacitor from the input node when the second capacitor is determined to be defective.

8. The system of claim 7, wherein the capacitor charger includes a switch connected to the input node and configured to electrically connect a supply voltage to the input node when activated.

9. The system of claim 8, wherein the capacitor charger further includes a comparator connected to the input node and the switch and configured to compare an input voltage at the input node to a reference voltage and to activate and deactivate the switch based on the result of the comparison.

10. The system of claim 9, wherein the capacitor charger further includes a switch activation-preventing device connected between the comparator and the switch and configured to prevent the switch from being activated by the comparator when enabled.

11. The system of claim 7, wherein the droop compensating mechanism further includes
a switch connected between the input and output nodes and configured to electrically connect the input and output nodes to each other when activated, and
a comparator connected to the output node and the switch and configured to compare an output voltage at the output node to a reference voltage and to activate and deactivate the switch based on the result of the comparison.

12. The system of claim 7, wherein the subsystem further includes a third capacitor and is further configured to electrically connect the third capacitor to the input node when the second capacitor is electrically disconnected thereby from the input node.

13. A method comprising:
charging a capacitor connected to an input node;
gradually decreasing an output voltage at an output node;
electrically connecting the input node to the output node, detecting whether the capacitor is defective; and
electrically disconnecting the capacitor from the input node when the capacitor is determined to be defective.

14. The method of claim 13, wherein the charging a capacitor is performed by electrically connecting a supply voltage to the input node.

15. The method of claim 14, further comprising comparing an input voltage at the input node to a reference voltage, wherein the electrically connecting a supply voltage to the input node is performed when it is determined that the input voltage is less than the reference voltage.

16. The method of claim 13, further comprising comparing the output voltage to a reference voltage, wherein the electrically connecting the input node to the output node is performed when it is determined that the output voltage is less than the reference voltage.

17. The method of claim 13, further comprising electrically connecting another capacitor to the input node when the electrically disconnecting the capacitor is performed.

18. The circuit of claim 1, wherein the second capacitor is determined to be defective based on one of a leakage current or a short in the second capacitor.

19. The system of claim 7, wherein the second capacitor is determined to be defective based on one a leakage current or a short in the second capacitor.

20. The method of claim 13 wherein the capacitor is determined to be defective based on one a leakage current or a short in the capacitor.

* * * * *